United States Patent
Kadota

(10) Patent No.: US 11,355,513 B2
(45) Date of Patent: Jun. 7, 2022

(54) SEMICONDUCTOR STORAGE DEVICE

(71) Applicant: Kioxia Corporation, Tokyo (JP)

(72) Inventor: Kenichi Kadota, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/013,229

(22) Filed: Sep. 4, 2020

(65) Prior Publication Data

US 2021/0288061 A1 Sep. 16, 2021

(30) Foreign Application Priority Data

Mar. 16, 2020 (JP) .............................. JP2020-045221

(51) Int. Cl.
| | |
|---|---|
| *H01L 27/11575* | (2017.01) |
| *H01L 27/11565* | (2017.01) |
| *H01L 27/11582* | (2017.01) |
| *H01L 21/768* | (2006.01) |
| *H01L 23/522* | (2006.01) |
| *H01L 23/528* | (2006.01) |
| *H01L 23/535* | (2006.01) |

(52) U.S. Cl.
CPC .. *H01L 27/11575* (2013.01); *H01L 21/76805* (2013.01); *H01L 21/76895* (2013.01); *H01L 23/5226* (2013.01); *H01L 23/5283* (2013.01); *H01L 23/535* (2013.01); *H01L 27/11565* (2013.01); *H01L 27/11582* (2013.01)

(58) Field of Classification Search
CPC ......... H01L 27/11575; H01L 27/11565; H01L 27/11582; H01L 21/76805; H01L 21/76895; H01L 23/5226; H01L 23/5283; H01L 23/535

USPC ........................................................ 257/326
See application file for complete search history.

(56) References Cited

U.S. PATENT DOCUMENTS

| | | | |
|---|---|---|---|
| 9,793,293 B1 | 10/2017 | Horibe et al. | |
| 2018/0269221 A1 | 9/2018 | Oda et al. | |
| 2019/0252396 A1* | 8/2019 | Mushiga | H01L 29/40117 |
| 2020/0357811 A1* | 11/2020 | Kim | H01L 27/11582 |

FOREIGN PATENT DOCUMENTS

JP 2018-157096 A 10/2018

* cited by examiner

*Primary Examiner* — Tu-Tu V Ho
(74) *Attorney, Agent, or Firm* — Oblon, McClelland, Maier & Neustadt, L.L.P.

(57) ABSTRACT

According to one embodiment, a semiconductor storage device includes a stacked body that includes a plurality of first conductive layers stacked with a first insulating layer interposed therebetween and has a stair portion and a memory portion; and a first structure that extends in the stacked body in a predetermined direction and divides the stacked body, the first structure including a projection extending in the stacking direction across the plurality of first conductive layers, on a side surface thereof in the stair portion wherein the first structure includes: a second insulating layer that is provided in the projection; and a third insulating layer that covers end surfaces of the plurality of first conductive layers and the first insulating layer facing toward the first structure and continuously extends in the first structure over the memory portion and the stair portion.

17 Claims, 29 Drawing Sheets

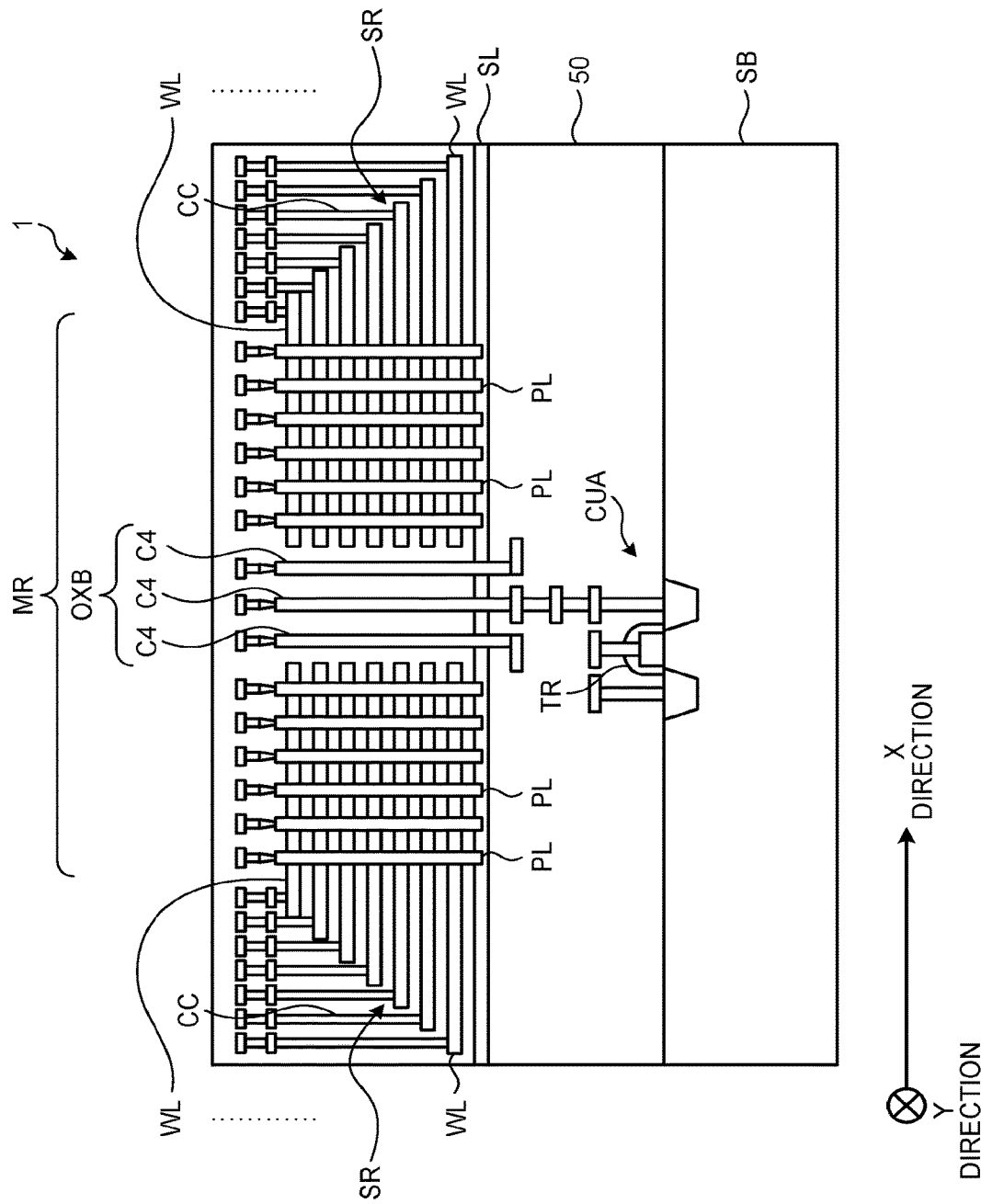

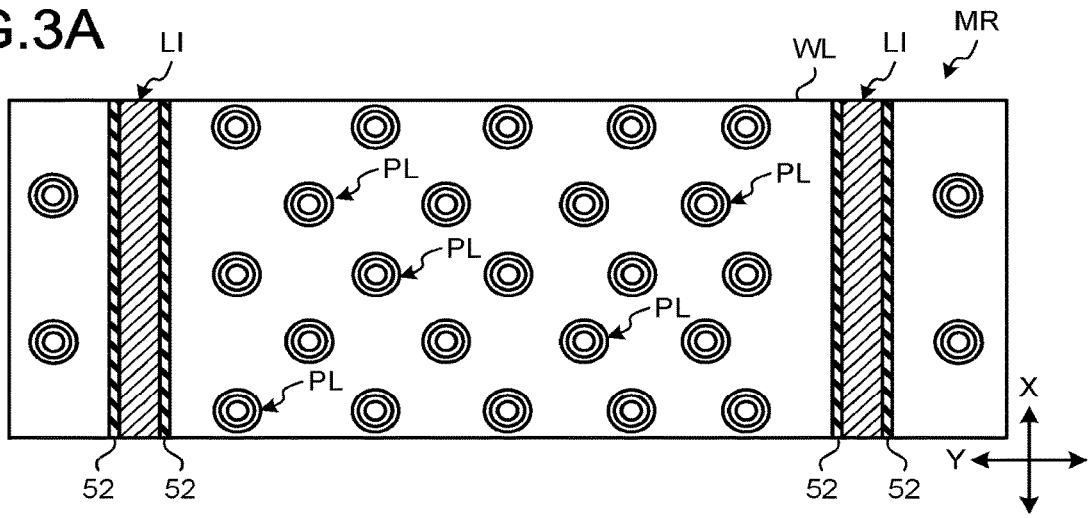
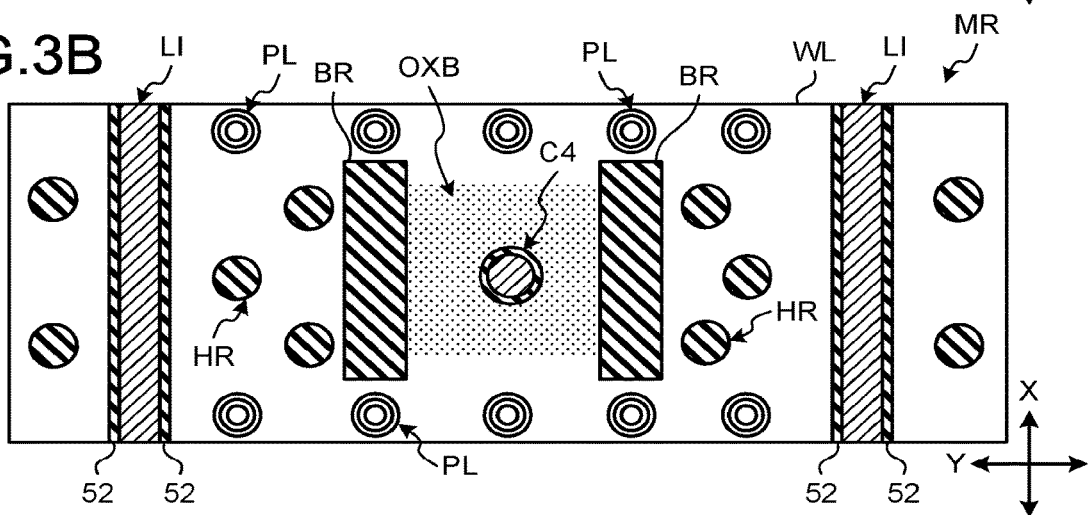
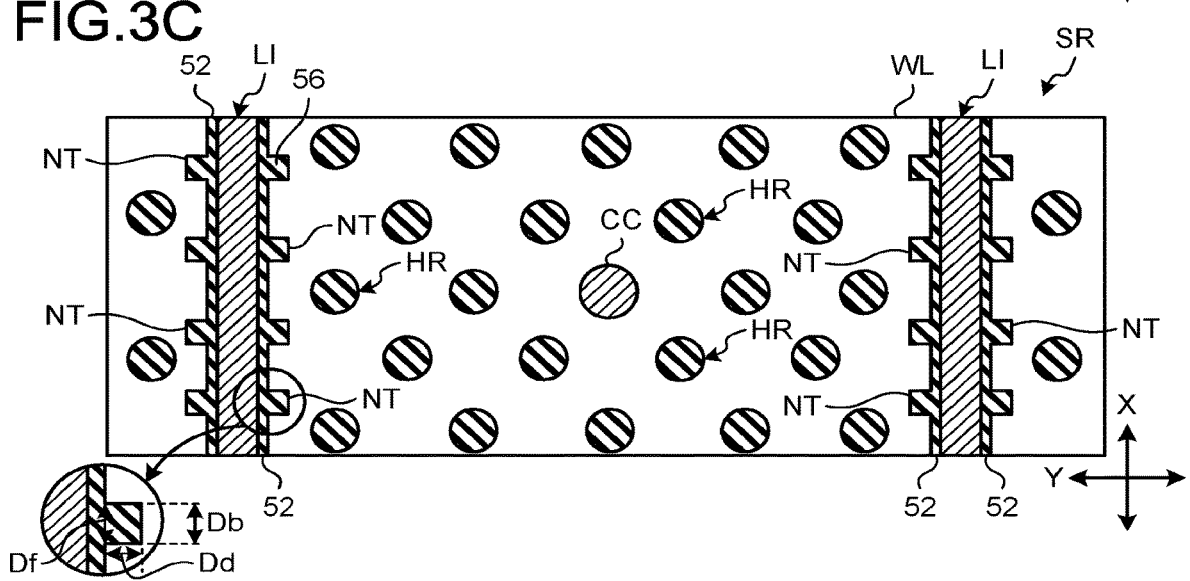

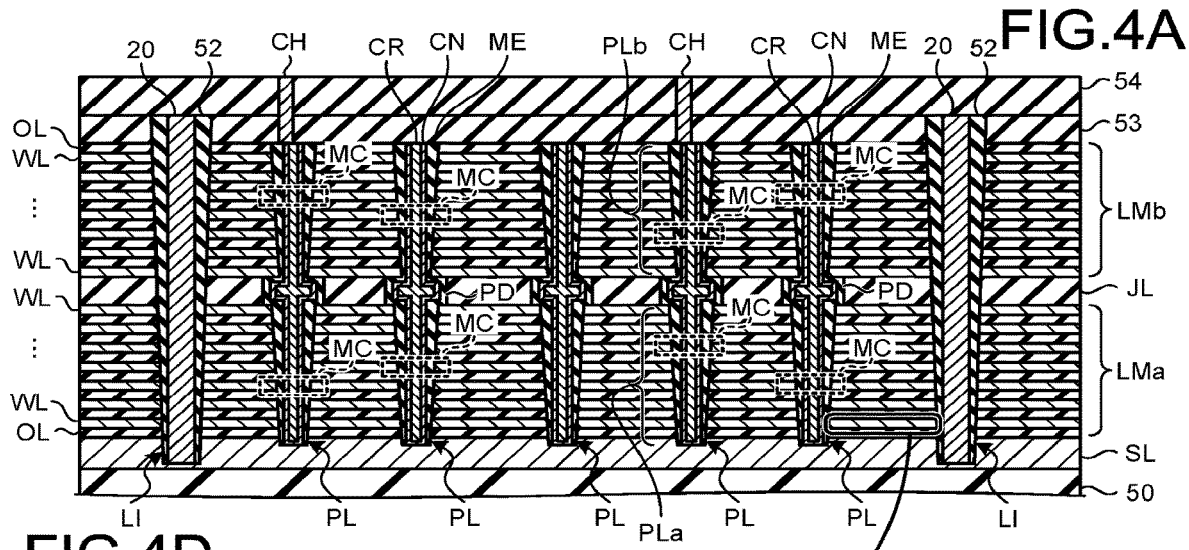
FIG.4A
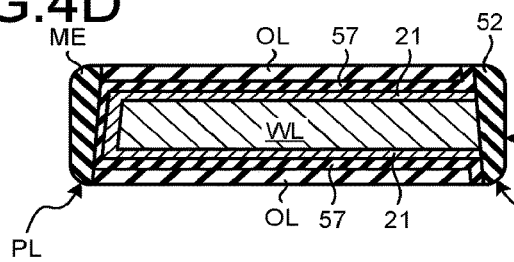
FIG.4D
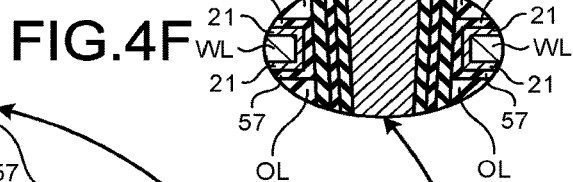
FIG.4E
FIG.4F
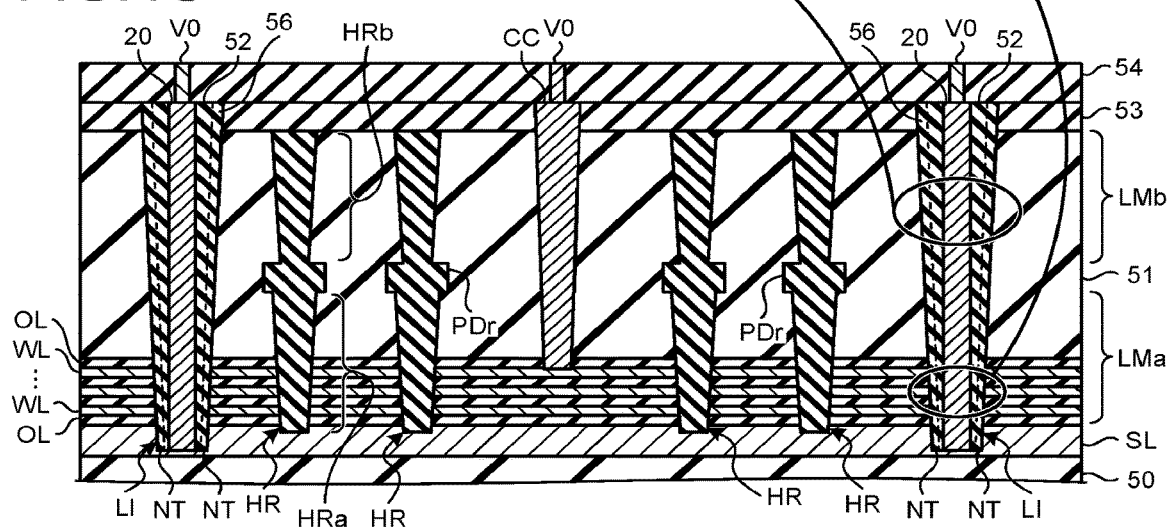
FIG.4C

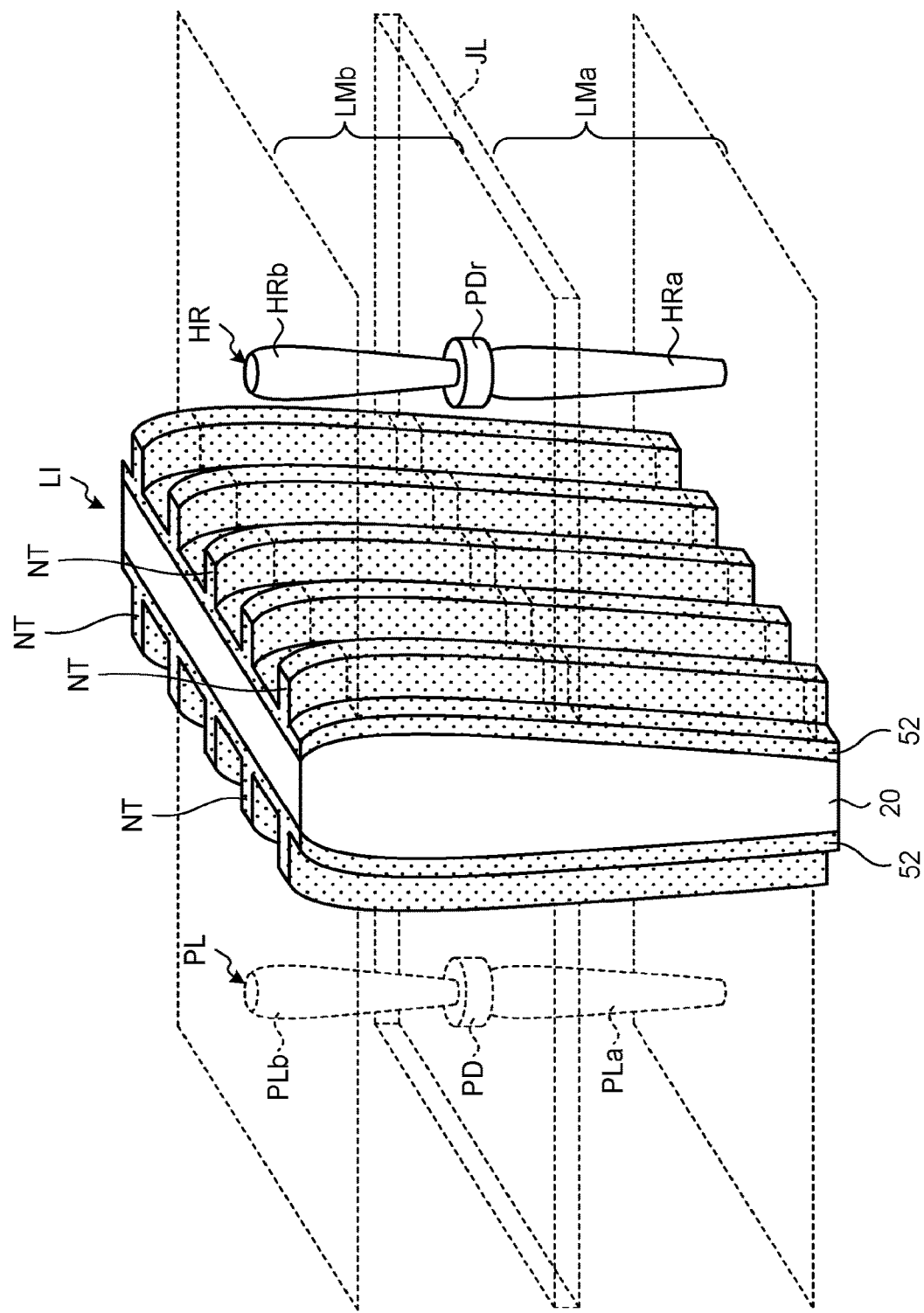

SEMICONDUCTOR STORAGE DEVICE

CROSS-REFERENCE TO RELATED APPLICATIONS

This application is based upon and claims the benefit of priority from Japanese Patent Application No. 2020-045221, filed on Mar. 16, 2020; the entire contents of which are incorporated herein by reference.

FIELD

Embodiments described herein relate generally to a semiconductor storage device.

BACKGROUND

In a three-dimensional nonvolatile memory, memory cells are three-dimensionally arranged for a plurality of stacked conductive layers. In such a structure, the challenge is how to maintain the strength of the stacked structure.

BRIEF DESCRIPTION OF THE DRAWINGS

FIG. 1 is a cross-sectional view illustrating a schematic configuration example of a semiconductor storage device according to an embodiment;

FIGS. 3A to 3C are lateral cross-sectional views of the semiconductor storage device according to the embodiment;

FIG. 4A and FIG. 4C to FIG. 4F are cross-sectional views illustrating a more detailed layer structure of the semiconductor storage device according to the embodiment;

FIG. 5 is a perspective cross-sectional view illustrating a pillar, a columnar portion, and a projection of a contact included in the semiconductor storage device according to the embodiment;

DETAILED DESCRIPTION

Figure 2A:
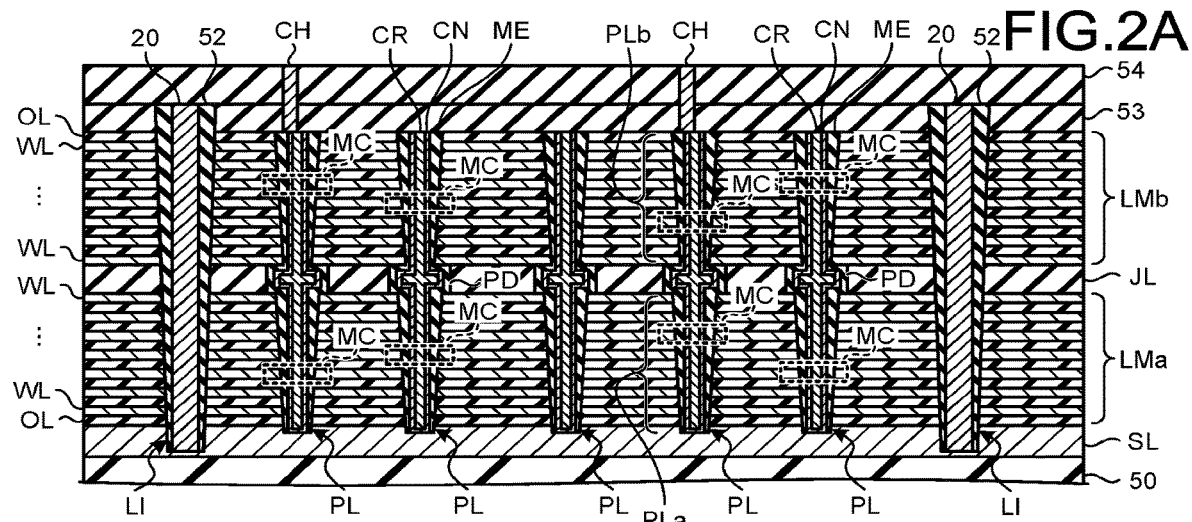
FIGS. 2A to 2C are cross-sectional views of the semiconductor storage device according to the embodiment taken along a Y direction.

In general, according to one embodiment, a semiconductor storage device includes: a stacked body that includes a plurality of first conductive layers stacked with a first insulating layer interposed therebetween and has a stair portion in which end portions of the plurality of first conductive layers have a stair shape and a memory portion in which a plurality of memory cells are arranged; a first pillar that extends in the stacked body in the memory portion in a stacking direction of the stacked body, the plurality of memory cells being formed at portions where the first pillar intersects with at least some of the plurality of first conductive layers; and a first structure that extends in the stacked body in the memory portion and the stair portion in the stacking direction and a first direction intersecting with the stacking direction and divides the stacked body, the first structure including a plurality of projections on a side surface thereof in the stair portion, the plurality of projections continuously extending in the stacking direction across the plurality of first conductive layers, wherein the first structure includes: a second insulating layer that is provided in the plurality of projections; and a third insulating layer that covers end surfaces of the plurality of first conductive layers and the first insulating layer facing toward the first structure through positions of the plurality of projections and positions between adjacent projections while interposing the second insulating layer therebetween at the positions of the plurality of projections, and continuously extends in the first structure over the memory portion and the stair portion.

The present invention will be explained below in detail with reference to the accompanying drawings. Note that the present invention is not limited to the following embodiments. In addition, components in the following embodiments include those that can be easily assumed by those skilled in the art or those that are substantially the same.

(Configuration Example of Semiconductor Storage Device)

FIG. 1 is a cross-sectional view illustrating a schematic configuration example of a semiconductor storage device 1 according to an embodiment. As illustrated in FIG. 1, the semiconductor storage device 1 includes a substrate SB, a peripheral circuit CUA, a memory portion MR, and a stair portion SR.

The substrate SB is a semiconductor substrate such as a silicon substrate. Peripheral circuits CUA including a transistor TR, wiring, and the like are arranged on the substrate SB.

The peripheral circuit CUA contributes to an operation of a memory cell described later. The peripheral circuit CUA is covered with an insulating layer 50. Source lines SL are arranged on the insulating layer 50. A plurality of word lines WL are stacked on the source line SL.

A plurality of pillars PL that penetrate the plurality of word lines WL in a stacking direction are arranged in the plurality of word lines WL. A plurality of memory cells are formed at intersecting portions between the pillars PL and the word lines WL. In this way, the memory portion MR in which the memory cells are three-dimensionally arranged is configured.

A penetrating contact region OXB having no word line WL is arranged in the memory portion MR. Contacts C4 that connect the peripheral circuits CUA below the memory portion MR to upper layer wirings or the like above the memory portion MR are arranged in the penetrating contact region OXB.

The stair portions SR are arranged, for example, on both sides of the memory portion MR in the X direction, and has a stair-shaped structure that stepwise rises toward the memory portion MR. Such a structure is configured by terminating the plurality of word lines WL in the stair shape.

Contacts CC that connect the word lines WL to the upper layer wirings or the like are arranged at end portions of the stair portions SR of each word line WL. In this way, the word lines WL stacked in multiple layers can be individually drawn out. In the present specification, a direction in which terrace surfaces of each stage of each stair portion SR face is defined as an upward direction.

Next, a detailed configuration example of the semiconductor storage device 1 will be described with reference to FIGS. 2A to 5.

Figure 2B:
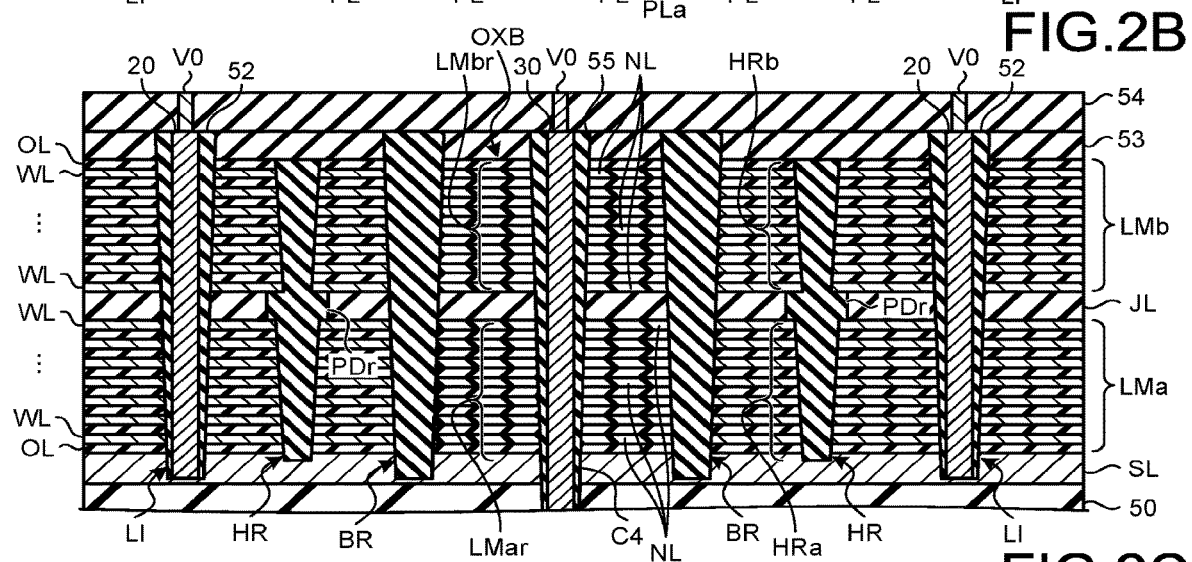
Figure 2C:
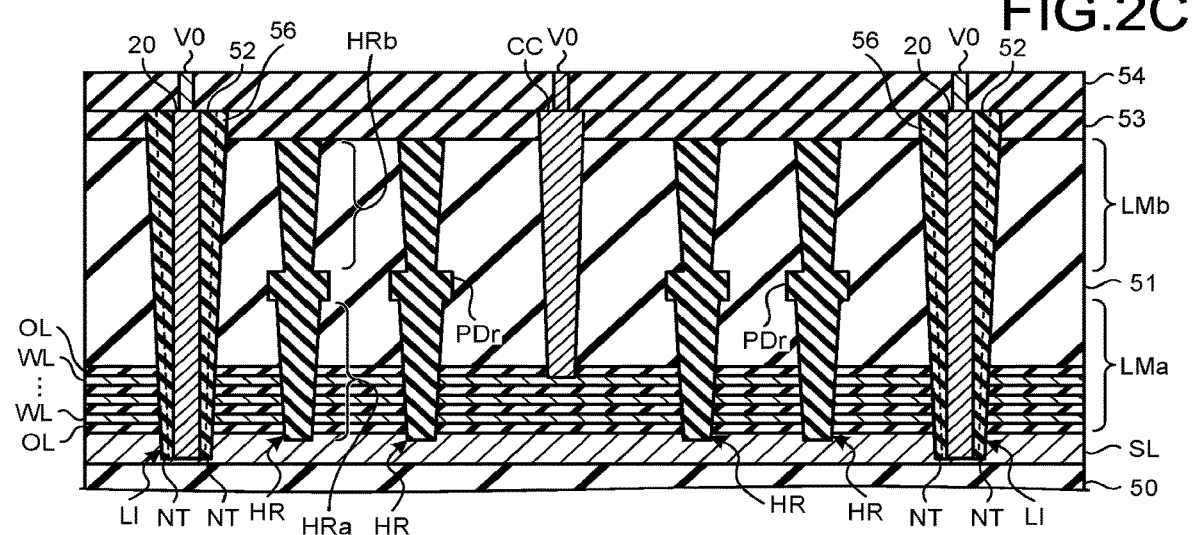

FIGS. 2A to 2C are cross-sectional views of the semiconductor storage device 1 according to the embodiment taken along a Y direction. FIG. 2A is a cross-sectional view of the memory portion MR, FIG. 2B is a cross-sectional view of a vicinity of the penetrating contact region OXB, and FIG. 2C is a cross-sectional view of the stair portion SR. However, in FIGS. 2A to 2C, a structure below the insulating layer 50 such as the substrate SB and the peripheral circuit CUA is omitted.

FIGS. 3A to 3C are lateral cross-sectional views of the semiconductor storage device 1 according to the embodiment. Specifically, FIGS. 3A to 3C are lateral cross-sectional views at a height position of the word line WL connected to the contact CC at the position of FIG. 2C of the stair portion SR among the plurality of word lines WL included in the semiconductor storage device 1. FIG. 3A is a lateral cross-sectional view of the memory portion MR, FIG. 3B is a lateral cross-sectional view of a vicinity of the penetrating contact region OXB, and FIG. 3C is a lateral cross-sectional view of the stair portion SR.

As illustrated in FIGS. 2A to 2C and 3A to 3C, the semiconductor storage device 1 includes, for example, the stacked portions LMa and LMb arranged on the source line SL, an insulating layer 53 covering the stacked portions LMa and LMb, and an insulating layer 54 arranged on the insulating layer 53. The source line SL is, for example, a polysilicon layer or the like.

The stacked portions LMa and LMb have a configuration in which the plurality of word lines WL as first conductive layers and a plurality of insulating layers OL as first insulating layers are alternately stacked. The stacked portion LMb is arranged on the stacked portion LMa with a joining layer JL interposed therebetween. The word line WL is, for example, a tungsten layer, a molybdenum layer, or the like. The insulating layer OL and the joining layer JL are, for example, a SiO$_2$ layer and the like.

In FIGS. 2A to 2C, the stacked portions LMa and LMb each have seven layers of word lines WL, but the number of layers of the word lines WL is arbitrary. In addition, the stacked portion LMa may be configured by arranging a select gate line (not illustrated) below a lowermost word line WL, and the stacked portion LMb may be configured by arranging the select gate line (not illustrated) above an uppermost word line WL.

Hereinafter, the configuration including the stacked portions LMa and LMb may be referred to as a stacked body. The stacked body may include the select gate line (not illustrated). The joining layer JL may be included in the stacked body. The stacked body may include stacked portions LMar and LMbr of the penetrating contact region OXB described later.

The stacked portions LMa and LMb include a memory portion MR in which a plurality of memory cells MC are three-dimensionally arranged, and a stair portion SR in which the end portions of the stacked portions LMa and LMb are formed in a stair shape. The stacked portions LMa and LMb are divided by contacts LI as a first structure that extends in the X direction. The memory portion MR and the stair portion SR are partitioned into a plurality of regions called blocks by the plurality of contacts LI arranged in the Y direction.

The plurality of contacts LI penetrate the insulating layer 53, the stacked portions LMa and LMb, and the joining layer JL in the stacking direction and reach the source line SL. Each contact LI has an insulating layer 52 as a third insulating layer that covers a side wall of the contact LI. Inside the insulating layer 52, the conductive layer 20 as the third conductive layer is filled. The insulating layer 52 is, for example, the SiO$_2$ layer or the like. The conductive layer 20 is, for example, a polysilicon layer, a tungsten layer, or the like. The conductive layer 20 of the contact LI is connected to the upper layer wiring via a plug VO penetrating the insulating layer 54.

By arranging the contact LI having the conductive layer 20 connected to the plug VO on the source line SL, the contact LI functions as a source line contact, for example. However, instead of the contact LI, the first structure filled with the insulating layer such as the SiO$_2$ layer may divide the stacked portions LMa and LMb in the Y direction.

Further, an insulating member (not illustrated) extending above the uppermost word line WL in the X direction is arranged in the memory portion MR of the stacked portion LMb. The insulating member is arranged, for example, above the central pillars PL among the pillars PL arranged in the Y direction in each block partitioned by the contacts LI so as to intersect with the pillars PL. The select gate lines (not illustrated) adjacent in the Y direction are formed above the stacked portion LMb with the insulating member interposed therebetween. The insulating member partitions, for example, the conductive layer above the uppermost word line WL into a select gate line pattern.

As illustrated in FIGS. 2A and 3A, in the memory portion MR, pillars PL as a plurality of first pillars are arranged in a matrix form in the stacked portions LMa and LMb between the two contacts LI. Each pillar PL penetrates the stacked portions LMa and LMb and the joining layer JL in the stacking direction and reaches the source line SL.

Each pillar PL has a shape in which a pillar PLa as a first sub-pillar that is a structure that penetrates the stacked portion LMa and a pillar PLb as a second sub-pillar that is a structure that penetrates the stacked portion LMb are joined to each other at a height position of the joining layer JL. The pillars PLa and PLb may have, for example, a tapered shape in which a diameter of a bottom surface is smaller than a diameter of an upper surface, a bowing shape in which a diameter is increased at a predetermined height position between the upper surface and the bottom surface, or the like.

Each pillar PL has a pedestal PD at a joined portion in the joining layer JL. The pedestal PD has a larger diameter than the upper surface of the pillar PLa arranged in the stacked portion LMa.

Each pillar PL has a memory layer ME, a channel layer CN, and a core layer CR in order from an outer peripheral of the pillar PL. The channel layer CN is also arranged at a bottom portion of the pillar PL. The memory layer ME is, for example, a layer in which a block layer such as the SiO$_2$ layer, a charge storage layer such as the SiN layer, and a tunnel layer such as the SiO$_2$ layer are stacked in this order from the outer peripheral of the pillar PL, the channel layer CN is, for example, an amorphous silicon layer, a polysilicon layer, or the like, and the core layer CR is, for example, the SiO$_2$ layer or the like.

The channel layer CN of the pillar PL is connected to an upper layer wiring such as a bit line via a plug CH penetrating the insulating layers 53 and 54. Each pillar PL has the memory layer ME and the channel layer CN connected to the plug CH, and as a result, a plurality of memory cells MC are formed at each intersecting portion of the pillar PL and the word line WL.

However, among the five pillars PL arranged between the two contacts LI, the pillar PL on which the above-described insulating member is arranged, such as a central pillar PL, does not have the plug CH. Such pillars PL are arranged to maintain a regular arrangement of the plurality of pillars PL. No memory cells are formed on those side surfaces or functions of these memory cells are not valid.

As illustrated in FIGS. 2B and 3B, the penetrating contact region OXB is arranged at a predetermined position such as a center position in the X direction within the memory portion MR. The stacked portions LMar and LMbr in which the word lines WL of the stacked portions LMa and LMb are replaced by the insulating layers NL are arranged in the penetrating contact region OXB.

That is, the stacked portions LMar and LMbr have a configuration in which the plurality of insulating layers OL and the plurality of insulating layers NL different from the insulating layers OL are alternately stacked. The insulating layer NL is, for example, the SiN layer or the like. The number of layers and the height positions of the insulating layers NL configuring the stacked portions LMar and LMbr, respectively, are equal to the number of layers and the height positions of the word lines WL configuring the stacked portions LMa and LMb, respectively. The number of layers and the height positions of the insulating layers OL configuring the stacked portions LMar and LMbr, respectively, are equal to the number of layers and the height positions of the insulating layers OL configuring the stacked portions LMa and LMb, respectively. The joining layer JL is interposed between the stacked portions LMar and LMbr.

In the penetrating contact region OXB, the contact C4 is arranged so as to penetrate the insulating layer 53, the stacked portions LMar and LMbr, the joining layer JL, and the source line SL in the stacking direction. The contact C4 is electrically connected to the transistor TR (see FIG. 1) and the like included in the peripheral circuit CUA on the substrate SB. The contact C4 has the insulating layer 55 that covers the side wall of the contact C4 and the conductive layer 30 that is filled inside the insulating layer 55. The insulating layer 55 is, for example, the SiO$_2$ layer or the like. The conductive layer 30 is, for example, a tungsten layer or the like. The conductive layer 30 of the contact C4 is connected to the upper layer wiring via the plug VO penetrating the insulating layer 54.

Since the stacked portions LMar and LMbr are mainly constituted by the insulating layers NL and OL, even if the contacts C4 are arranged to penetrate the stacked portions LMar and LMbr, a conduction with the word lines WL of the stacked portions LMa and LMb surrounding the circumference of the penetrating contact region OXB, an occurrence of a leakage current, or the like can be suppressed. Although simply illustrated in FIGS. 2B and 3B, the plurality of contacts C4 (see FIG. 1) may be arranged side by side in the penetrating contact region OXB, and even in such a case, the stacked portions LMar and LMbr constituted by the insulating layers NL and OL are arranged between the plurality of contacts C4, so the conduction between the plurality of contacts C4, the occurrence of the leakage current, or the like can be suppressed. Since the contact C4 has a liner of the insulating layer 55 around the conductive layer 30, the conduction with the word line WL and the occurrence of the leakage current are further suppressed.

Plate-like portions BR extending in the X direction are arranged on both sides of the penetrating contact region OXB in the Y direction. The plate-like portion BR penetrates the insulating layer 53, the stacked portions LMa and LMb, and the joining layer JL in the stacking direction and reaches the source line SL. The inside of the plate-like portion BR is filled with, for example, the insulating layer. As will be described later, the plate-like portion BR blocks the replacement of the insulating layer NL with the word line WL, which is performed in the manufacturing process of the semiconductor storage device 1, within the penetrating contact region OXB.

The stacked portions LMa and LMb surrounding the circumference of the penetrating contact region OXB are separated from the stacked portions LMar and LMbr by the plate-like portion BR at least in the Y direction.

The plurality of columnar portions HR penetrating the stacked portions LMa and LMb and reaching the source line SL are arranged in a matrix form in the stacked portions LMa and LMb around the penetrating contact region OXB. Each columnar portion HR is filled with the insulating layer such as the SiO$_2$ layer.

Each columnar portion HR has a shape in which a columnar portion HRa that is a structure penetrating the stacked portion LMa and a columnar portion HRb that is a structure penetrating the stacked portion LMb are joined to each other at a height position of the joining layer JL. The columnar portions HRa and HRb may have, for example, a tapered shape in which a diameter of a bottom surface is smaller than a diameter of an upper surface, a bowing shape in which a diameter is increased at a predetermined height position between the upper surface and the bottom surface, or the like.

Each columnar portion HR has a pedestal PDr at the joined portion in the joining layer JL. The pedestal PDr has a larger diameter than an upper surface of the columnar portion HRa arranged in the stacked portion LMa.

The columnar portion HR supports a stacked structure included in the semiconductor storage device 1 which is being manufactured, in the process of manufacturing of the semiconductor storage device 1 which will be described later.

Next, the detailed structure of the stair portion SR will be described.

As described above, the stair portion SR is adjacent to the memory portion MR in the X direction and stepwise rises toward the memory portion MR. Therefore, a cross section structure of stair portion SR varies depending on the X-direction position. The word line WL and the insulating layer OL on the lowermost word line of the stacked portion LMa on the source line SL are arranged at a position farthest from the memory portion MR. As the stacked portion LMa approaches the memory portion MR, the stacked portion LMa on the source line SL has more layers, and furthermore, each layer of the stacked portion LMb is arranged via the joining layer JL, and the word line WL and the insulating layer OL on the uppermost layer of the stacked portion LMb are arranged at a position closest to the memory portion MR.

FIGS. 2C and 3C illustrate a stair portion SR of a third stage from below. The stair portion SR of the third stage is constituted by three pairs of word lines WL and insulating layers OL except for the lowermost insulating layer OL. The insulating layers 51 are arranged above the word lines WL and the insulating layers OL. In this way, each stage of the stair portion SR is covered with the insulating layers 51 so as to be substantially the same height as the upper surface of the stacked portion LMb in the memory portion MR. The insulating layer 53 is arranged on the insulating layer 51, and an insulating layer 54 is arranged on the insulating layer 53.

The contacts CC penetrating the insulating layers OL and the insulating layers 51 and 53 on the word line WL are connected to a third word line WL from below, which is the uppermost layer in the stair portion of the third stage. The contact CC is connected to the upper layer wiring via the plug V0 penetrating the insulating layer 54. In this way, in the stair portion SR, the word lines WL connected to each of the memory cells MC arranged in the height direction are drawn out in the stair shape, and are connected to the contacts CC arranged in each stage of the stair portion SR.

The columnar portions HR as a plurality of second pillars penetrating the insulating layers 51 and the stacked portions LMa and LMb are arranged in a matrix form around the contacts CC. At the position of FIG. 2C, each columnar portion HR penetrates the stair portion of the third stage of the stacked portion LMa from the upper surface of the insulating layer 51, and reaches the source line SL. The columnar portion HR arranged in the stair portion SR includes the columnar portion HRa as a third sub-pillar and the columnar portion HRb as a fourth sub-pillar, and has the same configuration, shape, and the like as the columnar portion HR arranged in the penetrating contact region OXB.

In the stair portion SR, the above-described contact LI includes projections NT extending in the stacking direction of the stacked portions LMa and LMb, outside both side surfaces thereof. The projection NT extends in the stacking direction of the stacked portions LMa and LMb across the plurality of word lines WL, and has, as the second insulating layer, an insulating layer 56 provided in the projection NT. Note that in FIG. 2C, a cross section of the contact LI at the position of the projection NT is illustrated. In FIG. 2C, the side surface of the contact LI at a position out of the projection NT is illustrated by a broken line.

In the example of FIG. 3C, the projections NT having a rectangular (substantially oblong) lateral cross section project to both sides in the Y direction at the same X-direction positions with respect to both side surfaces of the contact LI that is out of the projection NT. The projections NT on both sides of the contact LI are regularly arranged at a predetermined interval in the X direction, for example. Further, the projections NT are arranged so as not to overlap the arrangement of the columnar portions HR arranged in the Y direction at the X-direction positions, for example.

However, the X-direction positions of the projections NT may not be aligned on both sides of the contact LI. Further, the projections NT may be arranged at different periods on both sides of the contact LI.

In addition, the lateral cross section of the projection NT may have another polygonal shape such as a trapezoid or a triangle. The lateral cross section of the projection NT may have a rounded U shape or the like. In addition, in the projection NT projecting in the Y direction, it is preferable that a Y-direction projection width (projection amount) Dd from the side surface of the contact LI at a position out of the projection NT be equal to or greater than an X-direction width Df of the projection NT at a projection origin. In addition, as in the example in which the lateral cross section is trapezoidal, triangular or the like, it is preferable that an X-direction width Db of the projection NT at a tip projecting outside the contact LI be narrower than the X-direction width Df of the projection NT at the projection origin.

Irrespective of the shape of the lateral cross section of the projection NT, a cross sectional area of the projection NT is smaller than a cross sectional area of the columnar portion HR and the pillar PL at the same height positions in the stacked portions LMa and LMb.

At the position of the projection NT in the stair portion SR, the insulating layer 52 arranged on the side wall of the contact LI covers an end surface of the word line WL and the insulating layer OL facing toward the contact LI through a position of the projection NT and positions between adjacent projections NT while interposing the insulating layer 56 as the second insulating layer provided in the projection NT therebetween at a positon of the projection NT. In this way, the insulating layer 52 continuously covers the side surface of the contact LI other than the projection NT and the inner side of the projection NT forming a part of the side surface of the contact LI. That is, the insulating layer 52 continuously extends inside the contact LI over the memory portion MR and the stair portion SR described above. In addition, the conductive layer 20 inside the insulating layer 52 continuously extends within the contact LI over the memory portion MR and the stair portion SR described above.

As described above, even when the first structure filled with the insulating layer such as the $SiO_2$ layer is used instead of the contact LI, the insulating layer continuously extending within the contact LI is configured to continuously cover the side surface of the contact LI other than the projection NT and the inner side of the projection NT forming a part of the side surface of the contact LI.

FIG. 4A and FIG. 4C to FIG. 4F are cross-sectional views illustrating a more detailed layer structure of the semiconductor storage device 1 according to the embodiment. FIGS. 4A and 4C are the same as the views illustrated in FIGS. 2A and 2C described above.

As illustrated in FIG. 4A and FIGS. 4C to 4F, as a more detailed configuration of the above-described configuration, a barrier metal layer 21 and a metal element-containing block layer 57 are arranged around the word line WL so as to surround the word line WL. The barrier metal layer 21 as the second conductive layer is, for example, a TiN layer or the like. The metal element-containing block layer 57 is, for example, a metal oxide layer or the like such as an $Al_2O_3$ layer.

To describe these arrangements in more detail, the barrier metal layer 21 and the metal element-containing block layer 57 are arranged on the upper surface and the lower surface of the word line WL in order from the word line WL. Further, as illustrated in FIG. 4D which is a partially enlarged view of FIG. 4A, in the memory portion MR, the barrier metal layer 21 and the metal element-containing block layer 57 are arranged on the end surface of the word line WL facing the memory layer ME on the side surface of the pillar PL in order from the word line WL.

As a result, the barrier metal layer 21 and the metal element-containing block layer 57 may be partially arranged on the side surface of the contact LI. As illustrated in FIG. 4D, in the memory portion MR, the barrier metal layer 21 and the metal element-containing block layer 57 are not arranged on the end surface of the word line WL facing the insulating layer 52 on the side surface of the contact LI. On the other hand, the metal element-containing block layer 57 may be arranged on the end surface of the insulating layer OL facing the insulating layer 52 on the side surface of the contact LI. Further, an end portion of the barrier metal layer 21 that covers the upper and lower surfaces of the word line WL and is sandwiched between the word line WL and the metal element-containing block layer 57 may extend to a position in contact with the insulating layer 52 on the side surface of the contact LI.

Further, in the stair portion SR, the barrier metal layer 21 and the metal element-containing block layer 57 are arranged in the same manner as the above-described memory portion MR at the positions between the adjacent projections NT which are out of the projection NT. That is, the barrier metal layer 21 and the metal element-containing block layer 57 are not arranged on the end surface of the word line WL facing the insulating layer 52 on the side surface of the contact LI, and the metal element-containing block layer 57 may be arranged on the end surface of the insulating layer OL facing the insulating layer 52 on the side surface of the contact LI. On the other hand, as illustrated in FIG. 4F which is an enlarged view of the lower portion of the contact LI of FIG. 4C, at the position of the projection NT, the barrier metal layer 21 and the metal element-containing block layer 57 are arranged on at least a part of the end surface of the word line WL facing the projection NT on the side surface of the contact LI in order from the word line WL. On the other hand, the barrier metal layer 21 and the metal element-containing block layer 57 are not arranged on the end surface of the insulating layer OL facing the projection NT on the side surface of the contact LI.

Further, at the position of the projection NT, the metal element-containing block layer 57 may further be provided inside the projection NT of the contact LI. That is, as illustrated in FIG. 4E, which is an enlarged view of the upper portion of the contact LI of FIG. 4C, and FIG. 4F described above, the metal element-containing block layer 57 may be continuously arranged on a surface facing inside the contact LI of the insulating layer 56 of the projection NT in the stacking direction of the stacked portions LMa and LMb. That is, the metal element-containing block layer 57 may be interposed between the insulating layer 56 of the projection NT and the insulating layer 52 covering the inner side of the contact LI of projection NT.

As described above, when the metal element-containing block layer 57 is interposed between the insulating layers 52 and 56, it is considered that the metal element-containing block layer 57 is visually recognized to easily identify the insulating layers 52 and 56. However, even when the metal element-containing block layer 57 is not interposed between the insulating layers 52 and 56, the insulating layers 52 and 56 may be identifiable by visually recognizing an interface between the insulating layers 52 and 56, or the like.

Note that as illustrated in FIG. 4C and the like, the projection NT extends from an upper surface to a bottom surface of the contact LI in the stacking direction of the stacked portions LMa and LMb. The pillar PL and columnar portion HR have a shape in which structures arranged in the stacked portions LMa and LMb are joined to each other through a joined portion with an increased diameter, whereas the projection NT does not have a joined portion with an increased diameter over the stacked portions LMa and LMb, and is made into, for example, an integrated shape without effective discontinuous diameter change. The aspect is illustrated in FIG. 5.

FIG. 5 is a perspective cross-sectional view illustrating the pillar PL, the columnar portion HR, and the projection NT of the contact LI included in the semiconductor storage device 1 according to the embodiment. Although the pillar PL is not arranged in the stair portion SR, in FIG. 5, the pillar PL is drawn in a dotted line near the projection NT of the contact LI for comparison.

Note that the contact LI may have, for example, a tapered shape in which the width of the bottom surface is smaller than the width of the upper surface, a bowing shape in which the width is increased at the height position between the upper surface and the bottom surface, or the like. The projection NT along the side surface of the contact LI has a tapered shape in which the width or the projection amount of a lower end is smaller than the width and the projection amount of an upper end, or a shape in which the predetermined height position between the upper surface and the bottom surface has a bowing shape.

(Method for Manufacturing Semiconductor Storage Device)

Next, an example of a method for manufacturing a semiconductor storage device 1 according to an embodiment will be described with reference to FIGS. 6A to 29C.

FIGS. 6A to 27 are cross-sectional views illustrating an example of a procedure of a method for manufacturing a semiconductor storage device 1 according to an embodiment. A, B, and C in the same drawing number indicate different cross sections during the same process. A of FIGS. 6A to 15C, 17A to 17C, 19A to 19C, 21A to 21C, and 24A to 24C corresponds to the portion of FIG. 2A, B thereof corresponds to the portion of FIG. 2B, C thereof corresponds to the portion of FIG. 2C. A of FIGS. 16A to 16C, 18A to 18C, 20A to 20C, 22A to 22c, and 25A to 25C corresponds to the portion of FIG. 3A, B thereof corresponds to the portion of FIG. 3B, C thereof corresponds to the portion of FIG. 3C.

Hereinafter, a description will be started from a state after the peripheral circuit CUA including the transistor TR on the substrate SB is formed and the peripheral circuit CUA is covered with the insulating layer 50.

Figure 6A:
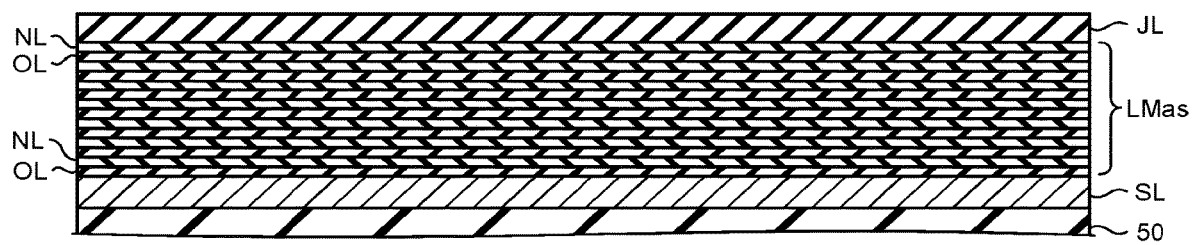
FIGS. 6A to 6C are cross-sectional views illustrating an example of a procedure of a method for manufacturing a semiconductor storage device according to an embodiment.
Figure 6B:
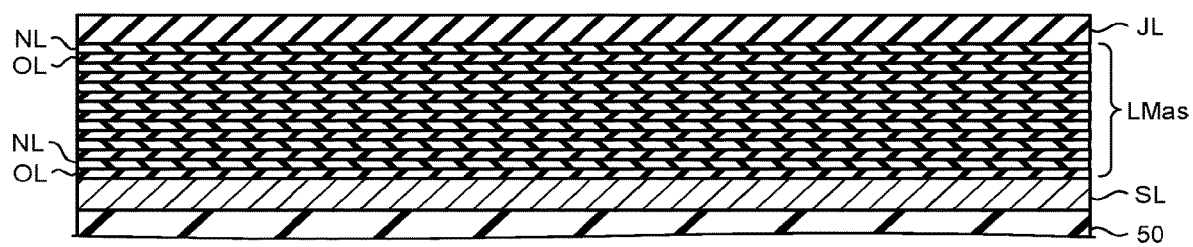
Figure 6C:
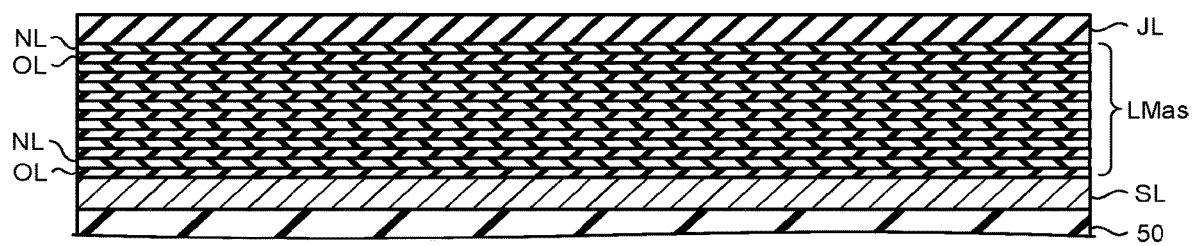

As illustrated in FIGS. 6A to 6C, the source line SL is formed on the insulating layer 50, and a stacked portion LMas in which a plurality of insulating layers NL and a plurality of insulating layers OL are alternately stacked is formed on the source line SL. An insulating layer NL as a sacrificing layer is, for example, a SiN layer or the like, and replaced with a conductive material later to become a word line WL. A joining layer JL is formed on the stacked portion LMas.

Figure 7A:
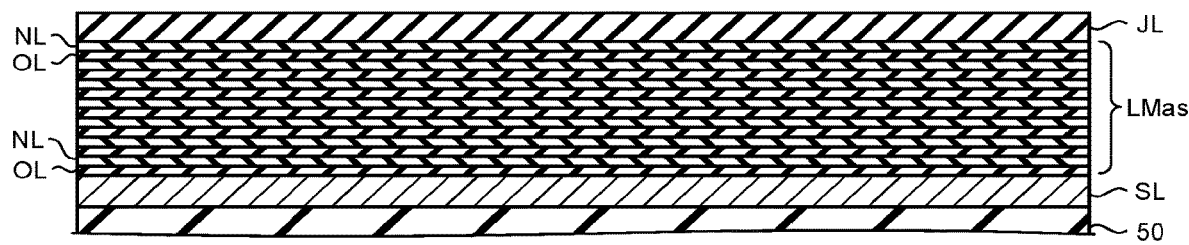
FIGS. 7A to 7C are cross-sectional views illustrating an example of the procedure of the method for manufacturing a semiconductor storage device according to an embodiment.
Figure 7B:
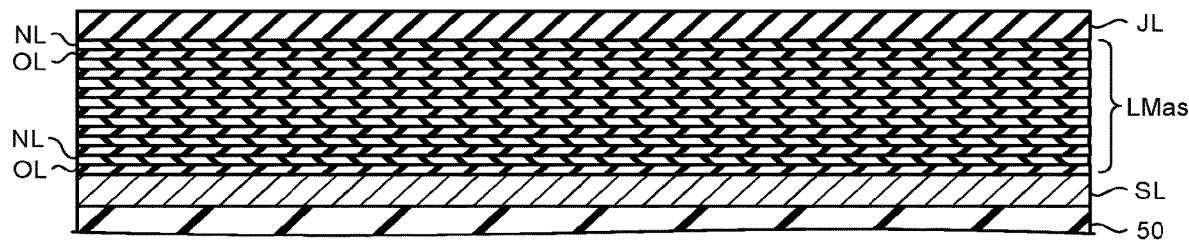
Figure 7C:
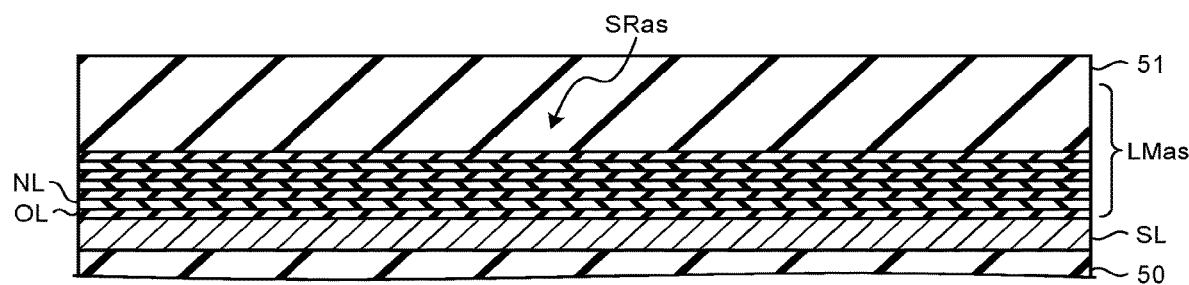

As illustrated in FIG. 7C, a stair portion SRas is formed in the stacked portion LMas. The stair portion SRas has a lower stair which is constituted by the stacked portion LMas, in the whole stair-shaped structure. At a position of FIG. 7C, the joining layer JL and the insulating layers NL and OL on an upper layer of the stacked portion LMas are removed, and a stair portion of a third stage from below is formed. A stepped portion of the stair portion SRas is provided with an insulating layer 51, for example, up to a height of an upper surface of the joining layer JL.

Figure 8A:
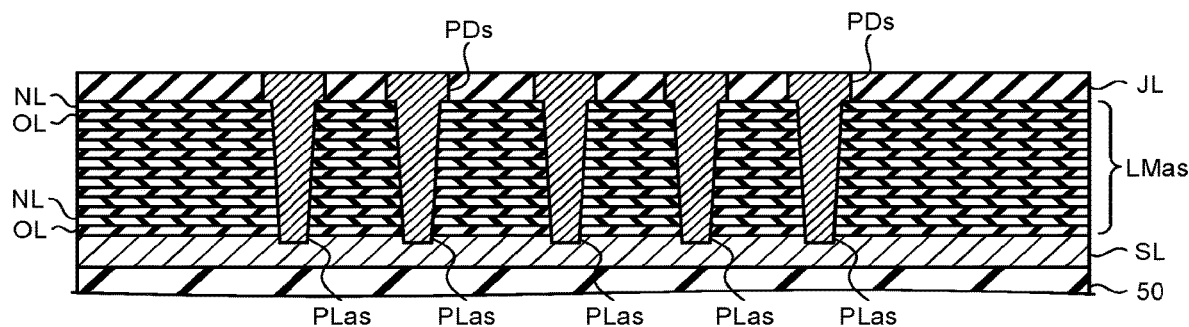
FIGS. 8A to 8C are cross-sectional views illustrating an example of the procedure of the method for manufacturing a semiconductor storage device according to the embodiment.

As illustrated in FIG. 8A, the stacked portion LMas is provided with a memory hole that reaches the source line SL by penetrating the joining layer JL and the stacked portion LMas and has an upper end with an increased diameter, and a sacrificing layer such as an amorphous silicon layer or the like is filled in the memory hole. As a result, a pillar PLas having a pedestal PDs is formed in a portion where the diameter of the upper end of the memory hole is increased.

Figure 8B:
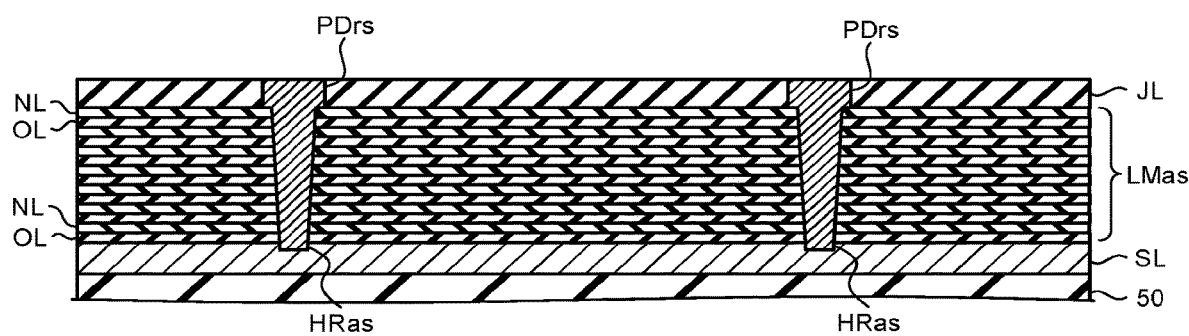
Figure 8C:
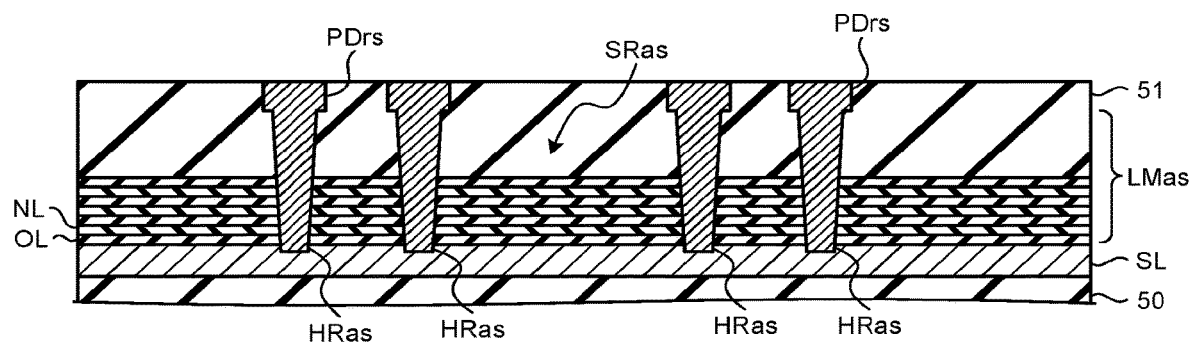

As illustrated in FIGS. 8B and 8C, the stacked portion LMas is provided with a hole that reaches the source line SL by penetrating the joining layer JL and the stacked portion LMas and has an upper end with an increased diameter, and a sacrificing layer such as an amorphous silicon layer or the like is filled in the hole. As a result, a columnar portion HRas is formed having a pedestal PDrs in a portion where the diameter of the upper end of the hole is increased.

Figure 9A:
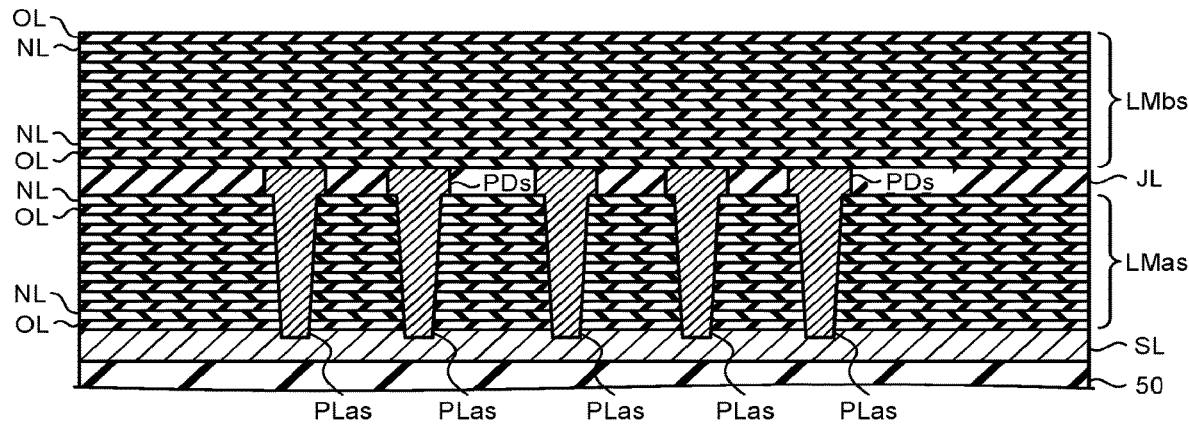
FIGS. 9A to 9C are cross-sectional views illustrating an example of the procedure of the method for manufacturing a semiconductor storage device according to the embodiment.
Figure 9B:
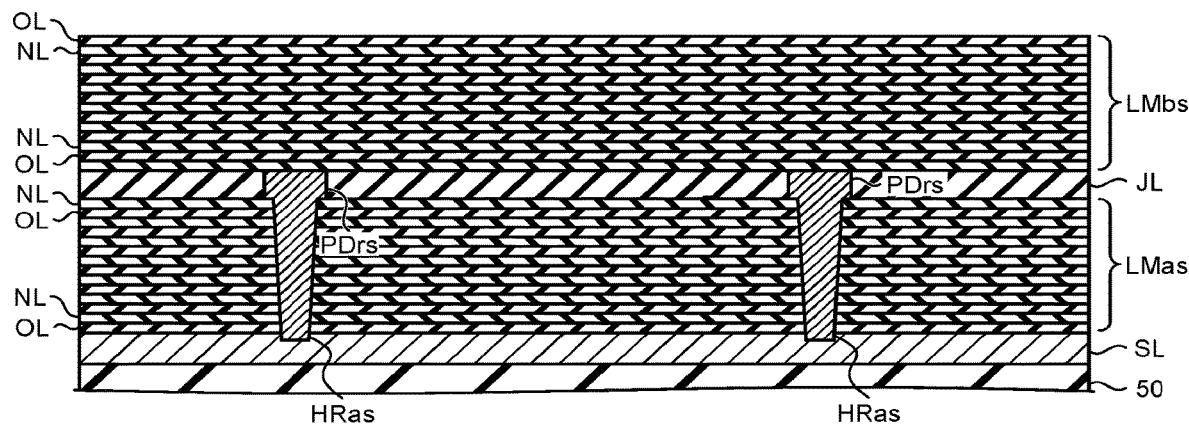
Figure 9C:
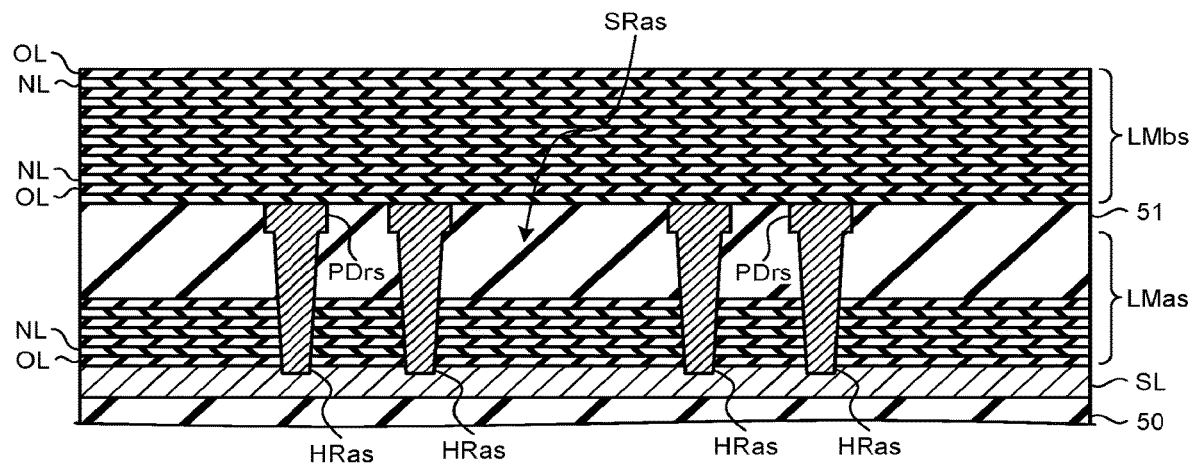

As illustrated in FIGS. 9A to 9C, a stacked portion LMbs in which a plurality of insulating layers NL and a plurality of insulating layers OL are alternately stacked is formed in an upper layer of each portion. That is, in the portion illustrated in FIGS. 9A and 9B, the stacked portion LMbs is formed on the stacked portion LMas via the joining layer JL. At the portion illustrated in FIG. 9C, the stacked portion LMbs are formed on the insulating layer 51.

Here, the above-described insulating member (not illustrated) may be formed on the stacked portion LMbs. The insulating member is formed, for example, by filling an insulator in a groove formed so as to penetrate the stacked portion LMbs (the sacrificing layer and the insulating layer on the upper layer thereof) halfway.

Figure 10A:
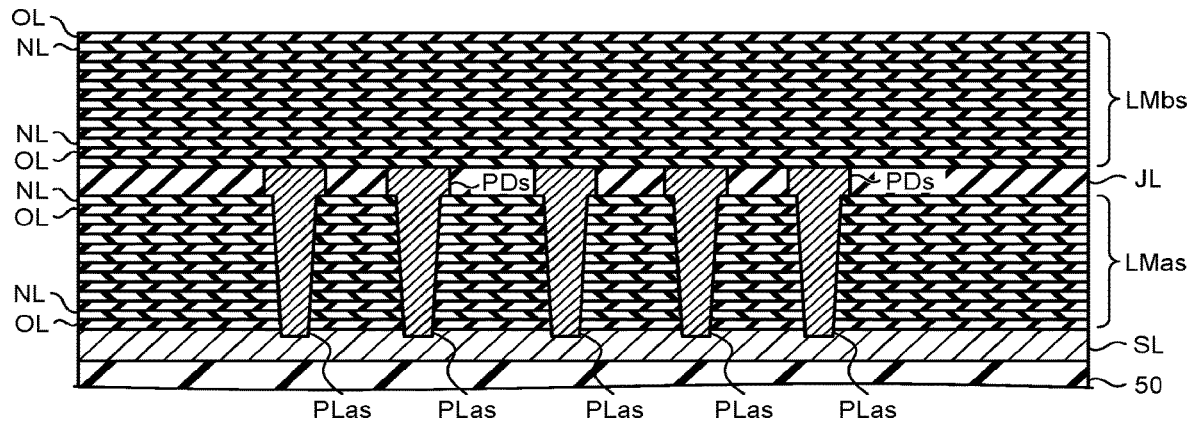
FIGS. 10A to 10C are cross-sectional views illustrating an example of the procedure of the method for manufacturing a semiconductor storage device according to the embodiment.
Figure 10B:
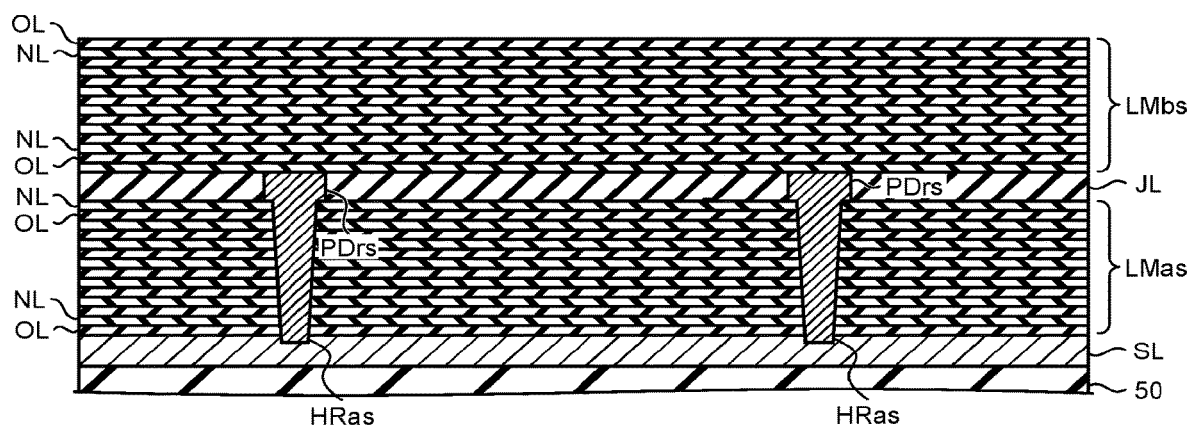
Figure 10C:
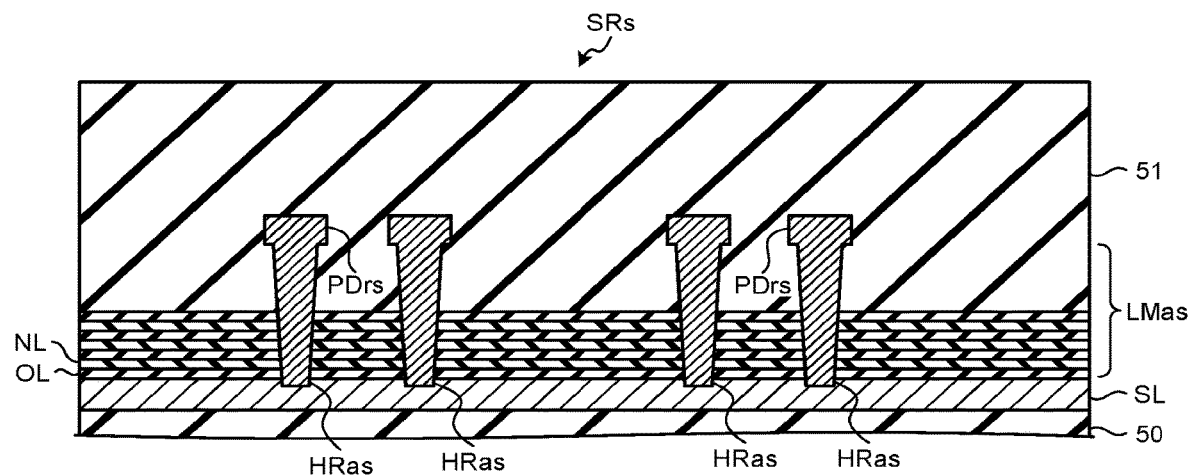

As illustrated in FIG. 10C, the stacked portion LMbs are processed to form a stair portion SRs including the stair portion SRas of the stacked portion LMas. The stair portion SRs has an entire stair-shaped structure constituted by the stacked portions LMas and LMbs. At the position of FIG. 10C, the whole of the stacked portion LMbs is removed, a stair portion SRs for a third stage from below remains. A stepped portion of the stair portion SRs is provided with an insulating layer 51, for example, up to a height of an upper surface of the stacked portion LMbs.

Figure 11A:
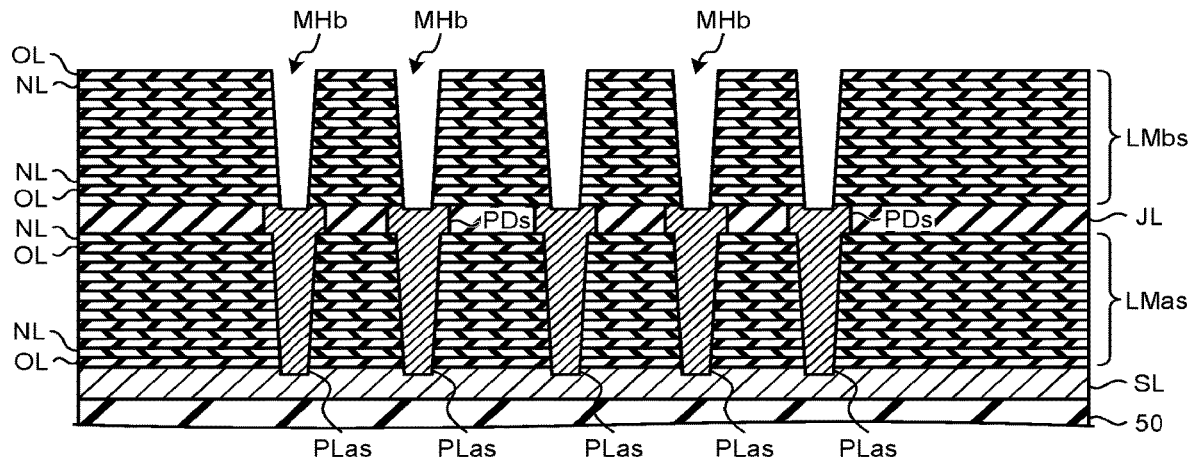
FIGS. 11A to 11C are cross-sectional views illustrating an example of the procedure of the method for manufacturing a semiconductor storage device according to the embodiment.

As illustrated in FIG. 11A, the stacked portion LMbs is provided with a memory hole MHb penetrating the stacked portion LMb and connected to each pedestal PDs of the joining layer JL.

The pedestal PDs having a diameter larger than a diameter of the upper surface of the pillar PLas in the stacked portion LMas are arranged on the upper surface of the pillar PLas. Accordingly, when the memory hole MHb is formed in the stacked portion LMbs, even if the arrangement position of the pillar PLas and the arrangement position of the memory hole MHb are not completely aligned vertically due to misalignment or the like, the memory hole MHb and the pillar PLas can be connected via the pedestal PDs.

Figure 11B:
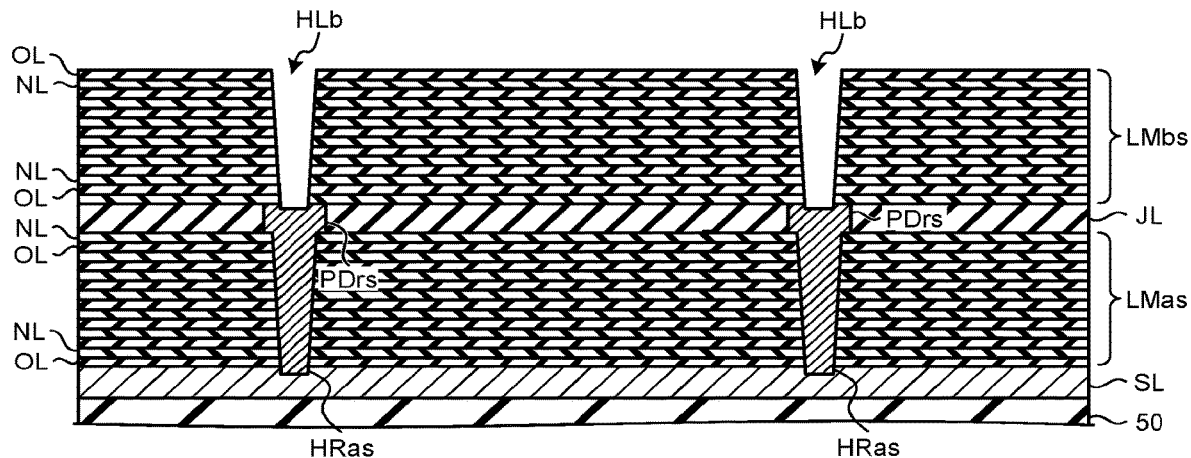
Figure 11C:
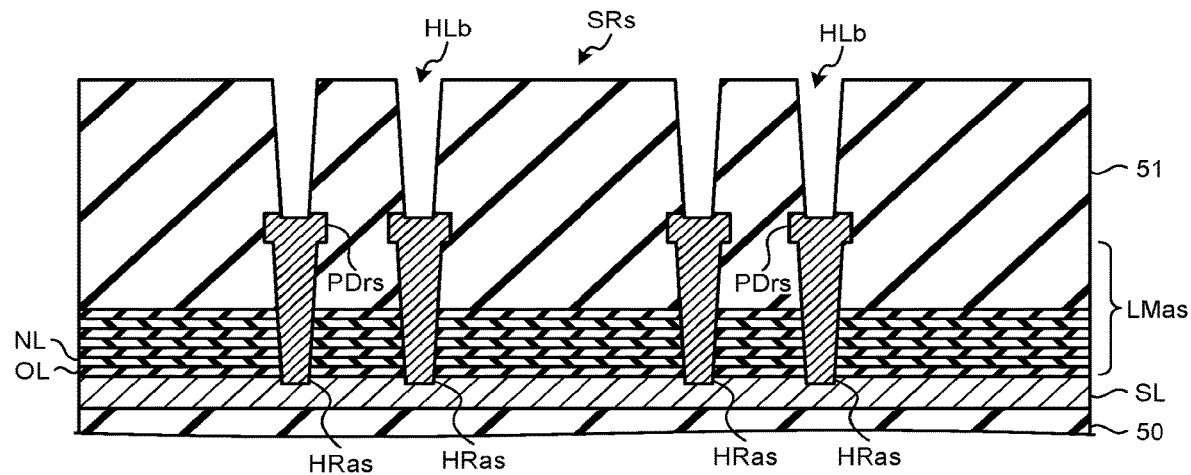

As illustrated in FIGS. 11B and 11C, the stacked portion LMbs is provided with a hole HLb penetrating the stacked portion LMb and connected to each pedestal PDrs of the joining layer JL.

The pedestal PDrs having a diameter larger than a diameter of the upper surface of the columnar portion HRas in the stacked portion LMas are arranged on the upper surface of the columnar portion HRas. In this way, when the hole HLb is formed in the stacked portion LMbs, even if the arrangement position of the columnar portion HRas and the arrangement position of the hole HLb are not completely aligned vertically due to misalignment or the like, the hole HLb and the columnar portion HRas can be connected via the pedestal PDrs.

Figure 12A:
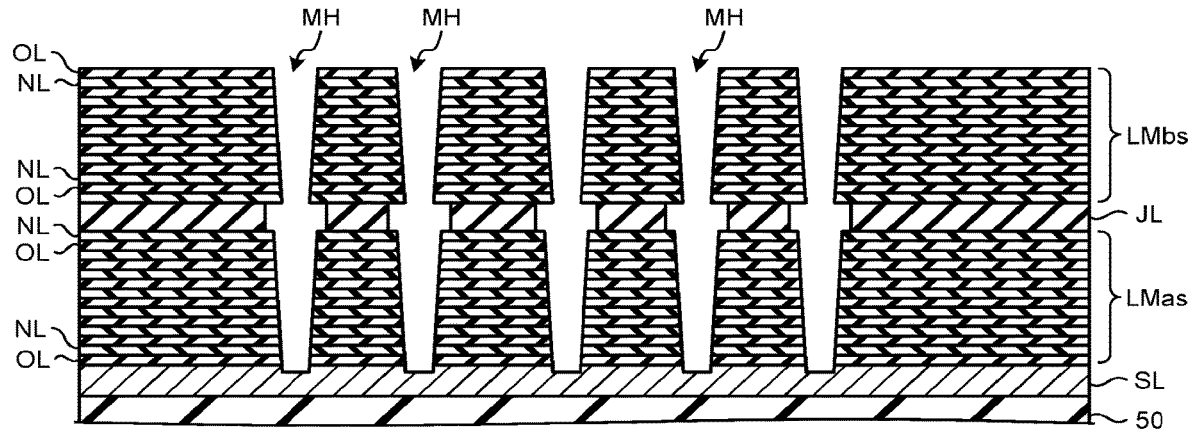
FIGS. 12A to 12C are cross-sectional views illustrating an example of the procedure of the method for manufacturing a semiconductor storage device according to the embodiment.

As illustrated in FIG. 12A, the sacrificing layer of the pillar PLas is removed via the memory hole MHb, and the memory hole MH that reaches the source line SL by penetrating the stacked portion LMbs, the joining layer JL, and the stacked portion LMas is formed.

Figure 12B:
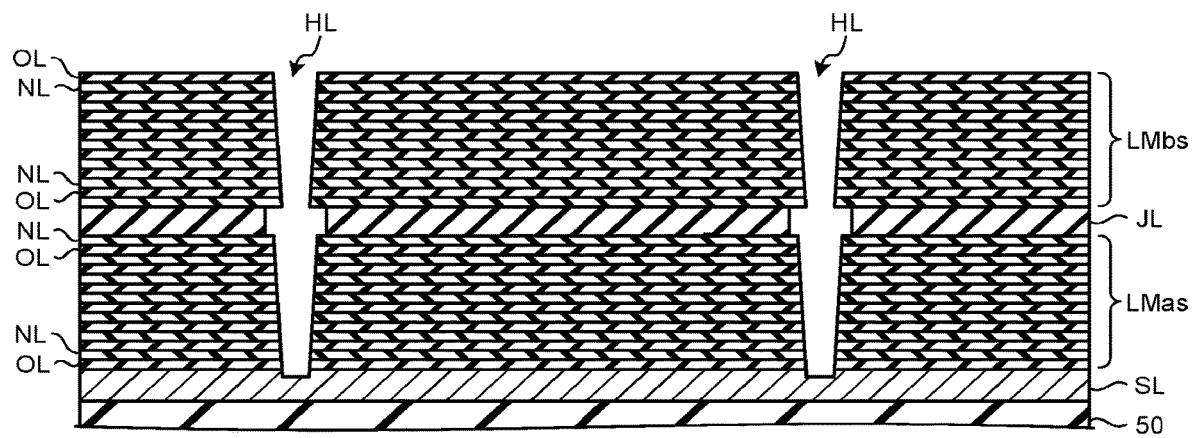
Figure 12C:
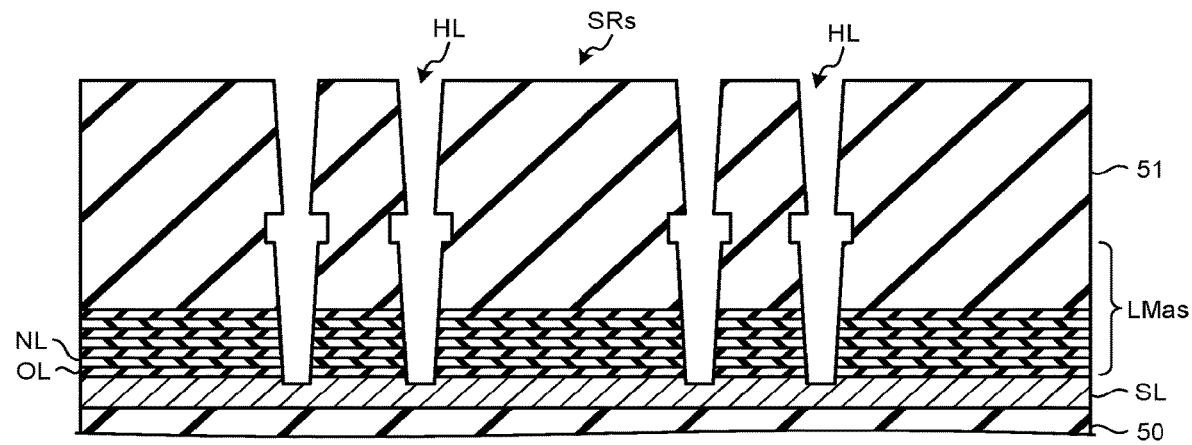

As illustrated in FIGS. 12B and 12C, the sacrificing layer of the columnar portion HRas is removed via the hole HLb, and the hole HL that reaches the source line SL by penetrating the stacked portion LMbs, the joining layer JL, and the stacked portion LMas is formed. At the position of FIG.

12C, a hole HL penetrating the insulating layer 51 and the stair portion SRs of the third stage from below is formed.

Figure 13A:
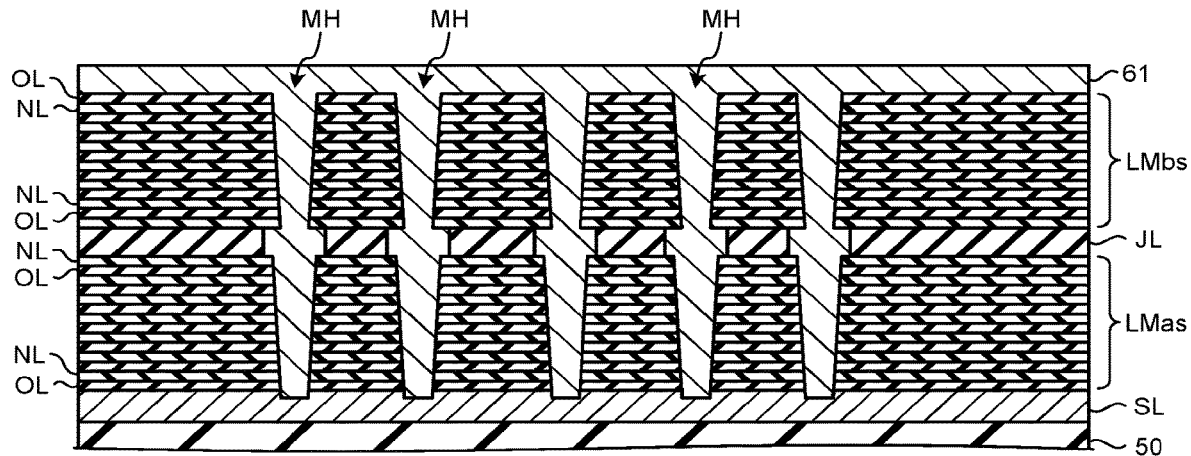
FIGS. 13A to 13C are cross-sectional views illustrating an example of the procedure of the method for manufacturing a semiconductor storage device according to the embodiment.

As illustrated in FIG. 13A, the memory hole MH is protected by a mask 61 or the like.

Figure 13B:
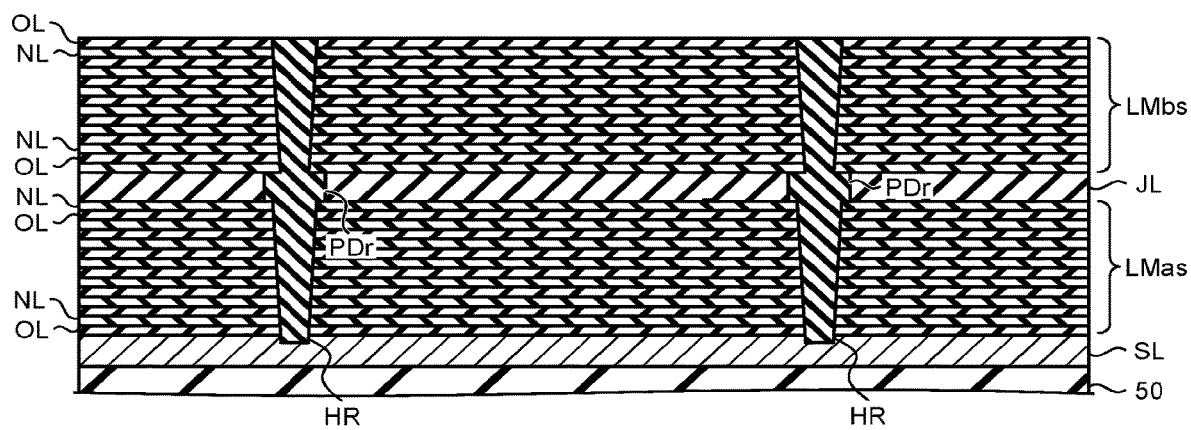
Figure 13C:
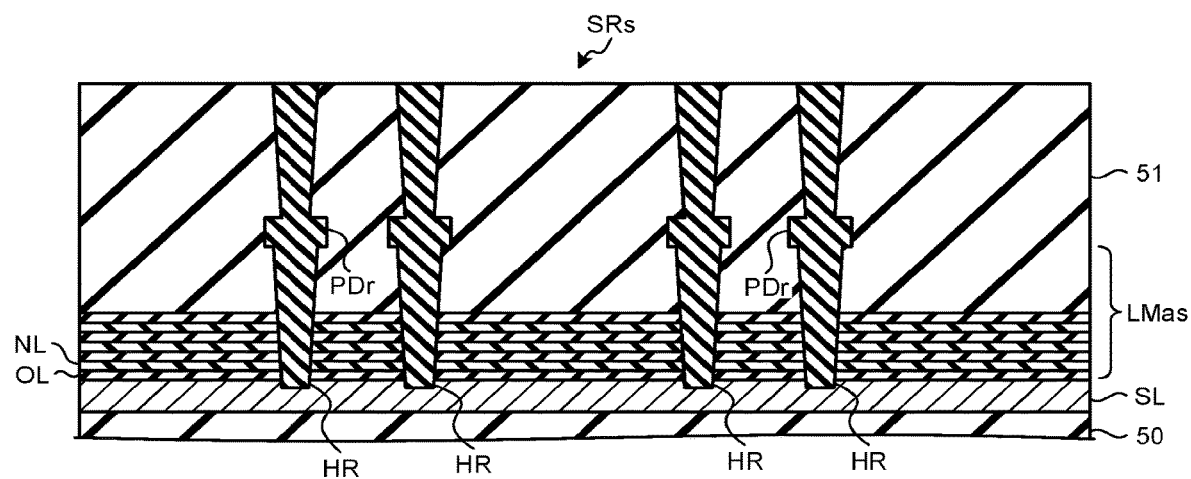

As illustrated in FIGS. 13B and 13C, the insulating layer is filled in the hole HL to form the columnar portion HR having the pedestal PDr in a central portion.

Figure 14A:
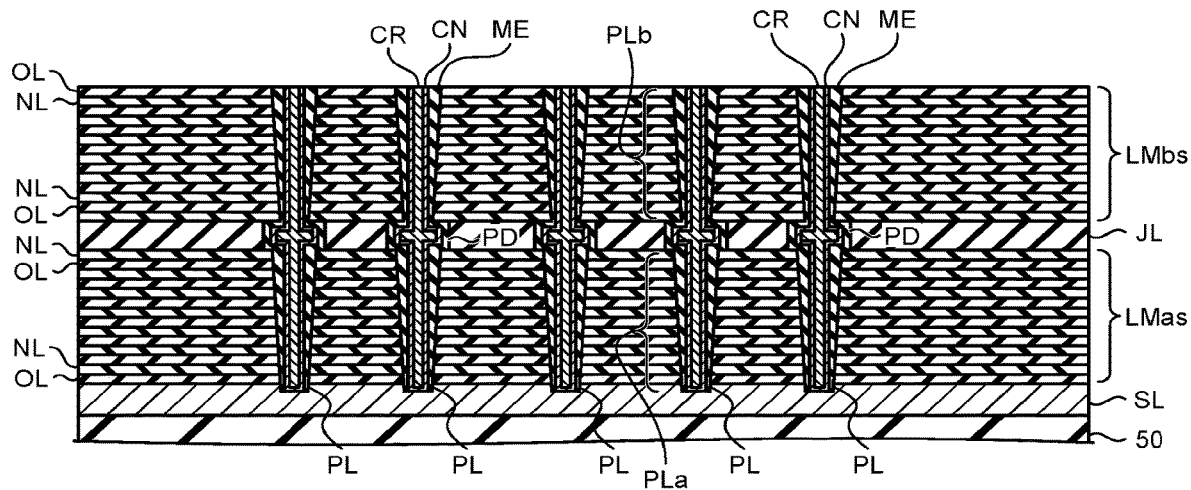
FIGS. 14A to 14C are cross-sectional views illustrating an example of the procedure of the method for manufacturing a semiconductor storage device according to the embodiment.

As illustrated in FIG. 14A, the pillars PL are formed in the stacked portions LMas and LMbs. That is, a memory layer ME such as a $SiO_2$ layer/SiN layer/$SiO_2$ layer, a channel layer CN such as an amorphous silicon layer or a polysilicon layer, and a core layer CR such as a $SiO_2$ layer are formed in order from a side wall of the memory hole MH. The channel layer CN is also formed at a bottom portion of the memory hole MH. As a result, the pillar PL having the pedestal PD is formed in the central portion.

Figure 14B:
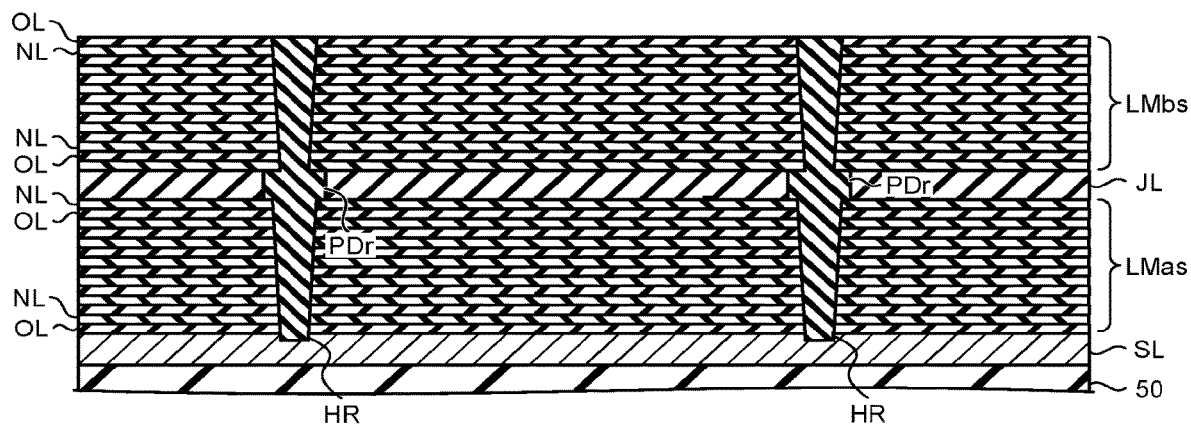
Figure 14C:
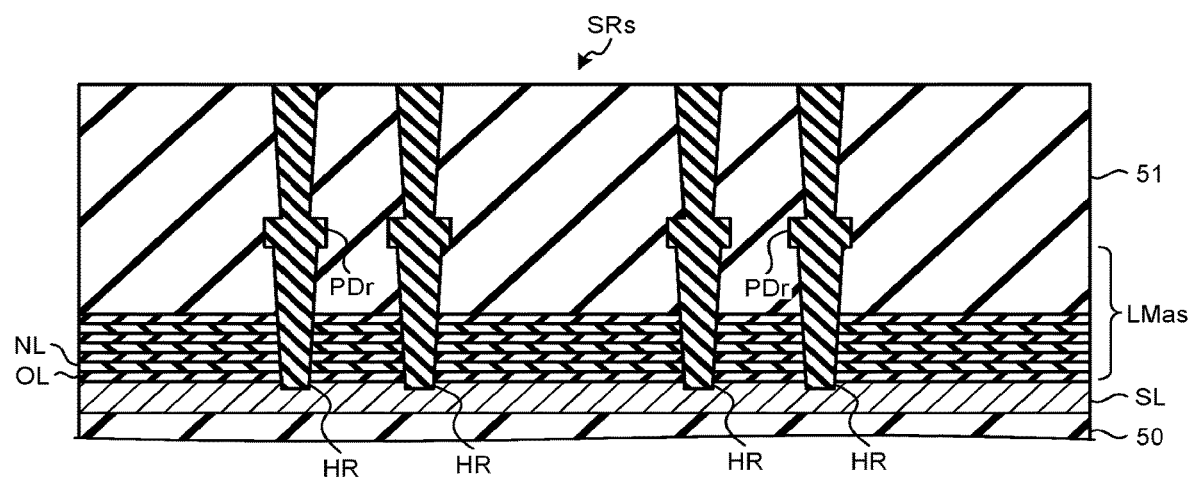

Note that steps illustrated in FIGS. 13A to 13C and steps illustrated in FIGS. 14A to 14C can be switched in the order of implementation.

Figure 15A:
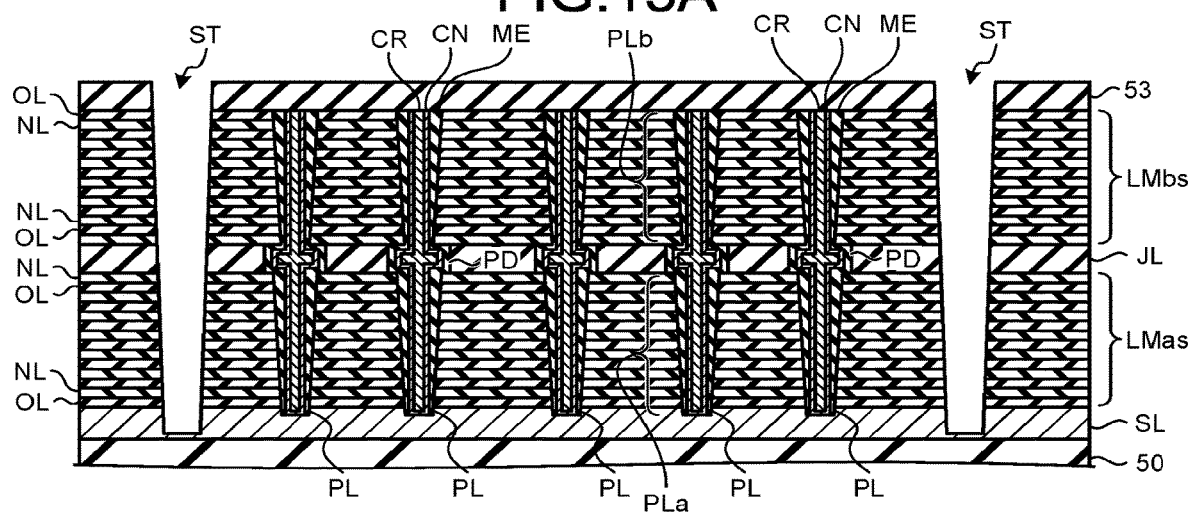
FIGS. 15A to 15C are cross-sectional views illustrating an example of the procedure of the method for manufacturing a semiconductor storage device according to the embodiment.
Figure 15B:
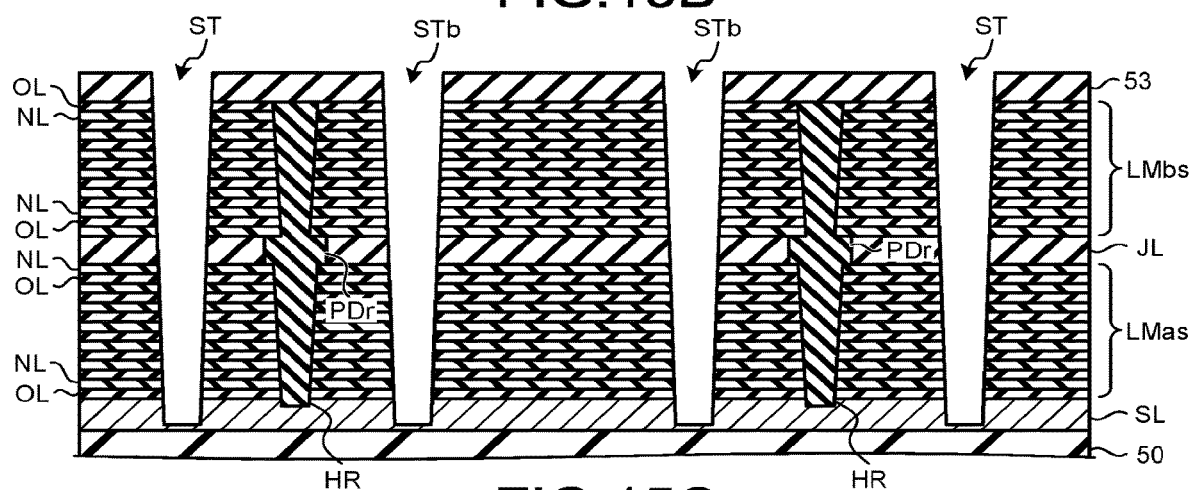
Figure 15C:
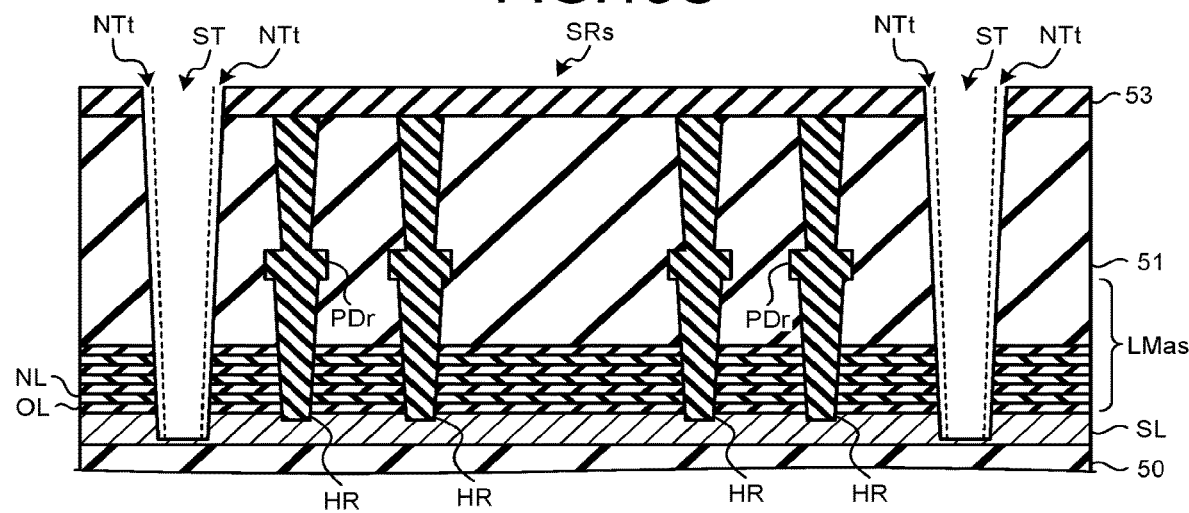

As illustrated in FIGS. 15A to 15C, an insulating layer 53 is formed in an upper layer of each portion. That is, at the portion illustrated in FIGS. 15A and 15B, the insulating layer 53 is formed on the stacked portion LMbs. In the portion illustrated in FIG. 15C, the insulating layer 53 is formed on the insulating layer 51.

As illustrated in FIGS. 15A and 15B, slits ST and STb that penetrate the insulating layer 53, the stacked portion LMbs, the joining layer JL, and the stacked portion LMas and reach the source line SL are formed. At this time, the slits ST and STb are collectively formed, for example, from the insulating layer 53 to a depth reaching the source line SL.

The slit ST is used later to replace the insulating layer NL with the word line WL, and then becomes the contact LI that divides the stacked portions LMas and LMbs. The slit SLb is used later to form a penetrating contact region OXB, and then becomes a plate-like portion BR arranged near the penetrating contact region OXB.

As illustrated in FIG. 15C, in the stair portion SRs, the slit ST is formed to penetrate the insulating layer 53, the insulating layer 51 on the upper layer of the stair portion SRs, and the stair portion SRs to reach the source line SL. Further, in the stair portion SRs, the side surface of the slit ST regularly has depression NTt depressed toward the stacked portions LMas and LMbs than other portions at predetermined intervals.

Figure 16A:
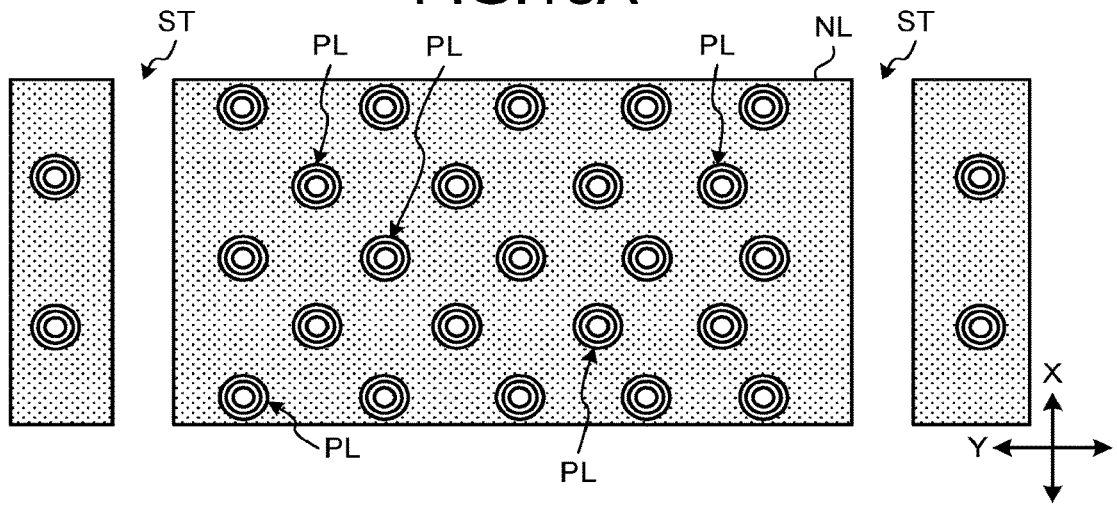
FIGS. 16A to 16C are lateral cross-sectional views illustrating an example of the procedure of the method for manufacturing a semiconductor storage device according to the embodiment.
Figure 16B:
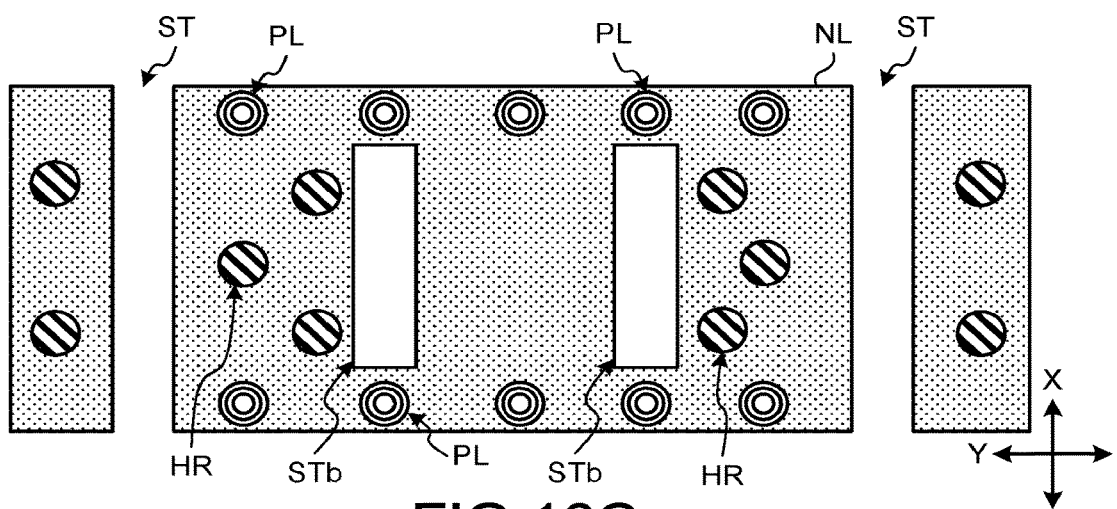
Figure 16C:
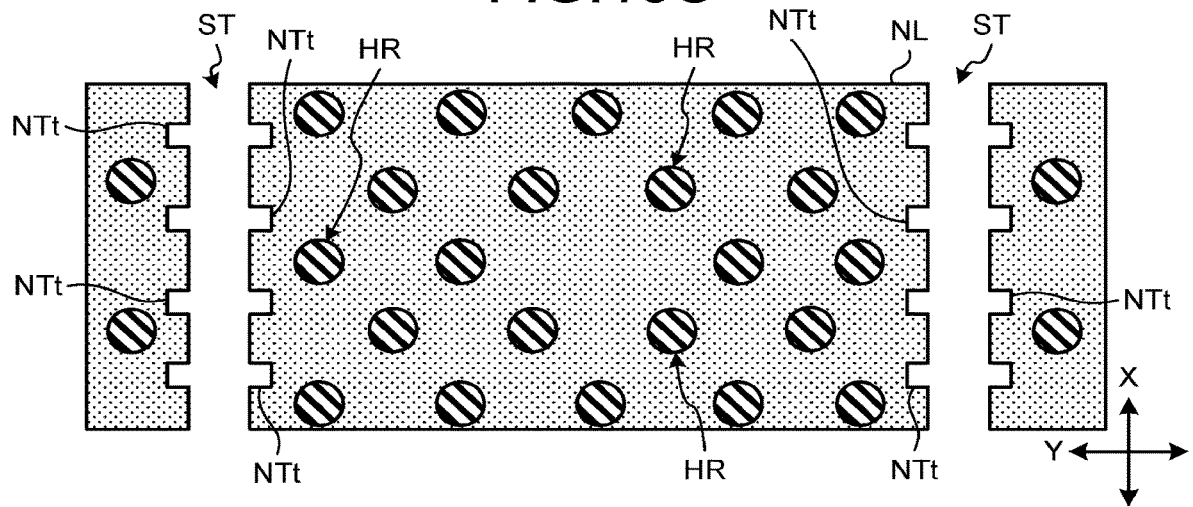

Here, FIGS. 16A to 16C illustrate lateral cross section shapes of the slits ST and STb formed in each portion.

FIGS. 16A to 16C are lateral cross-sectional views at the height position of the insulating layer NL on the uppermost layer in the stair portion SRs of the position illustrated in FIG. 15C among the plurality of insulating layer NL included in the semiconductor storage device 1 which is being manufactured.

As illustrated in FIGS. 16A to 16C, the slit ST is formed to extend in the X direction wholly in, for example, a region corresponding to the memory portion MR in FIG. 3A, in the vicinity of a region in which the penetrating contact region OXB of FIG. 3B is formed, and in a region corresponding to the stair portion SR of FIG. 3C. As described above, the slit ST has a plurality of depressions NTt regularly in the X direction in the stair portion SRs.

On the other hand, the slit STb is locally formed in the vicinity of a region in which the penetrating contact region OXB in the memory portion MR is formed.

Figure 17A:
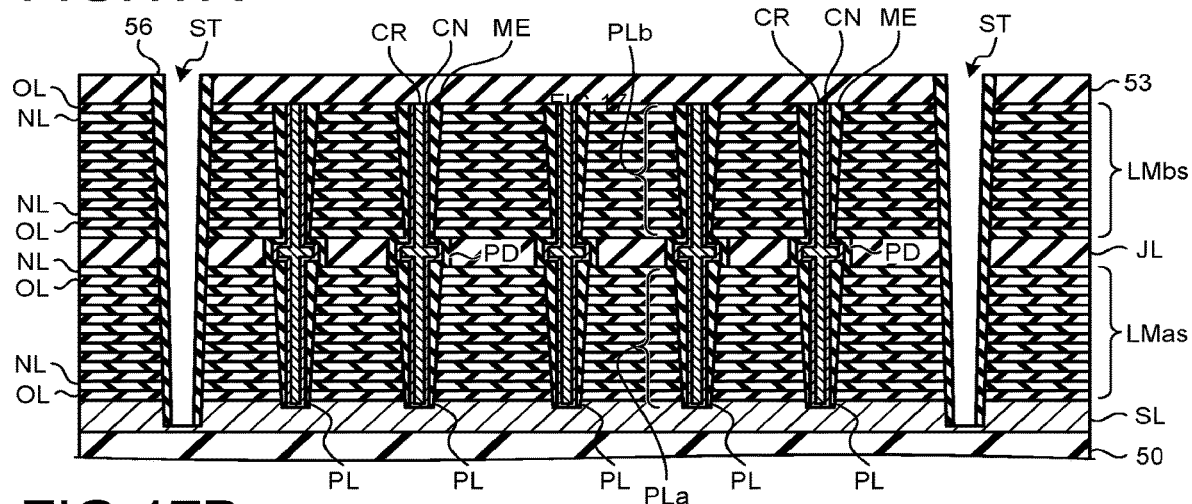
FIGS. 17A to 17C are cross-sectional views illustrating an example of the procedure of the method for manufacturing a semiconductor storage device according to the embodiment.
Figure 17B:
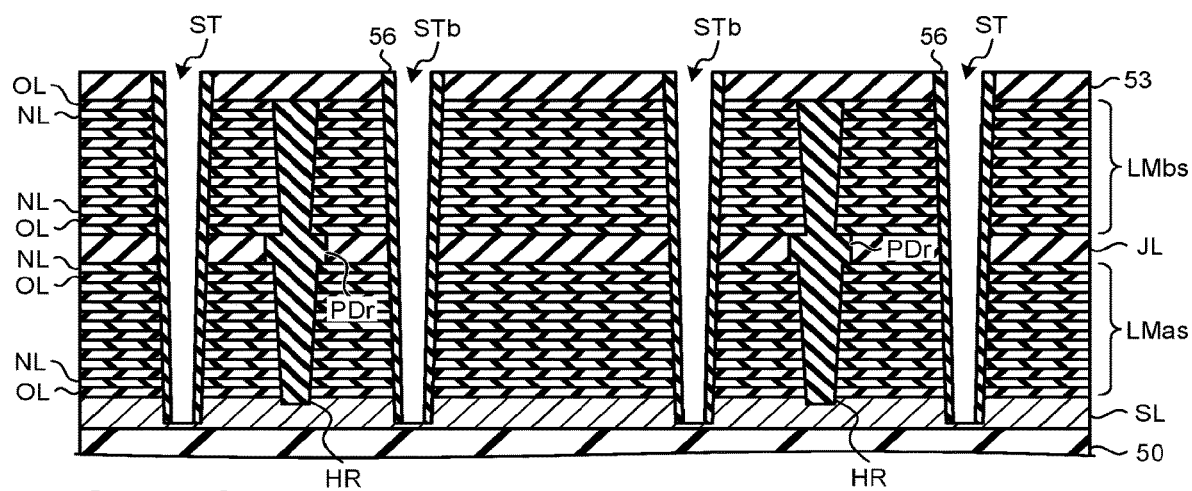
Figure 18A:
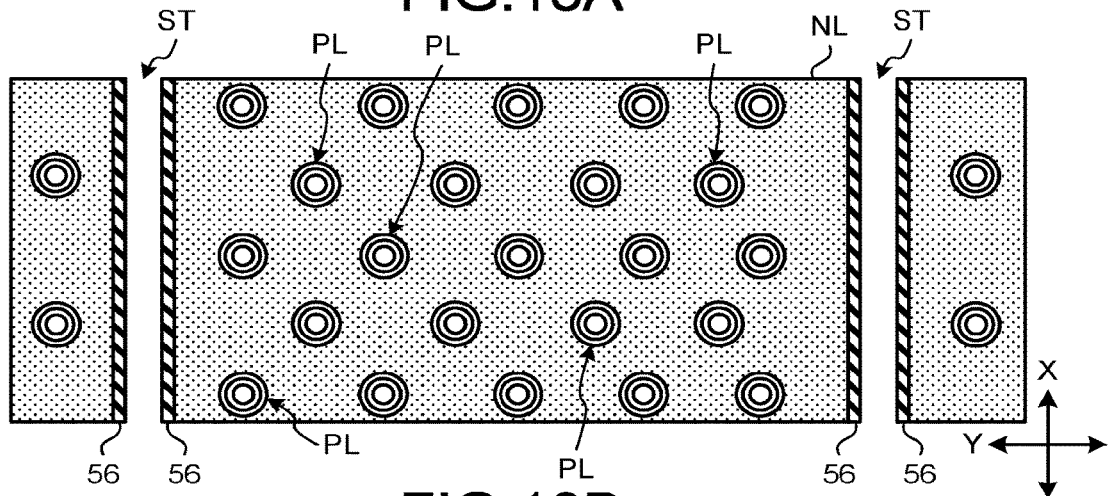
FIGS. 18A to 18C are lateral cross-sectional views illustrating an example of the procedure of the method for manufacturing a semiconductor storage device according to the embodiment.
Figure 18B:
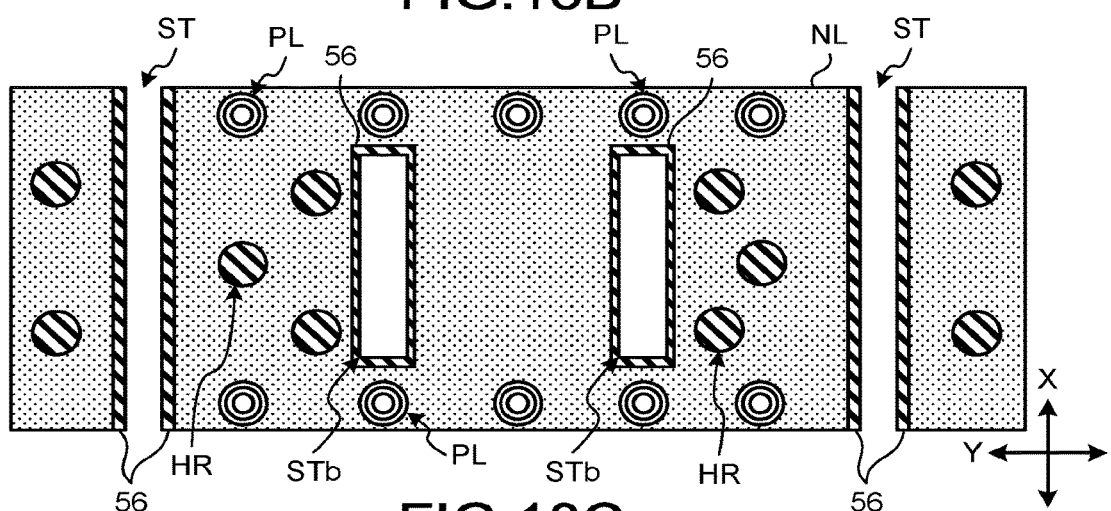
Figure 18C:
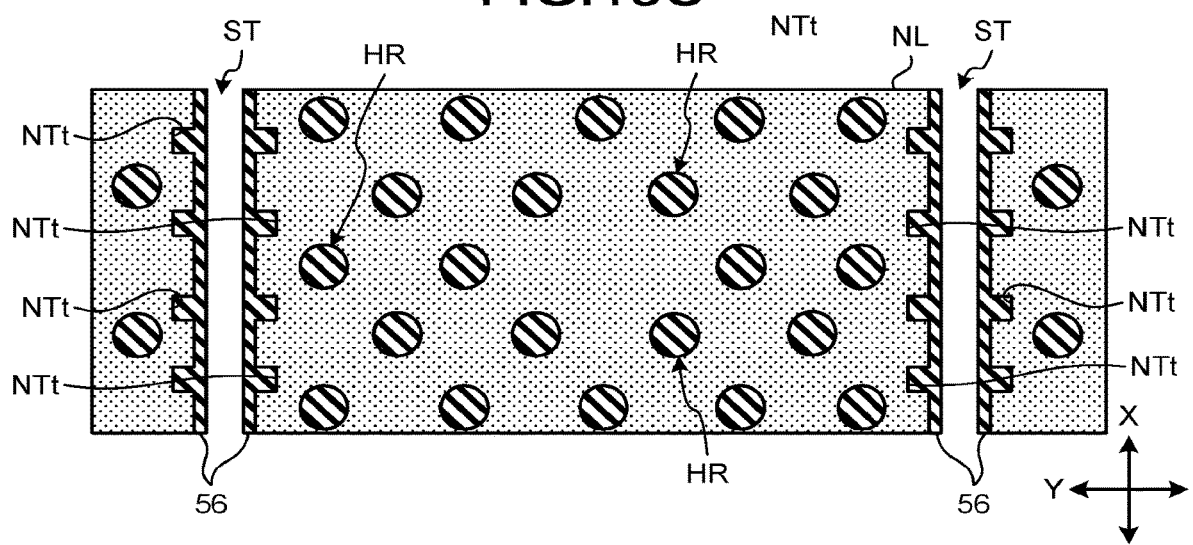
Figure 19A:
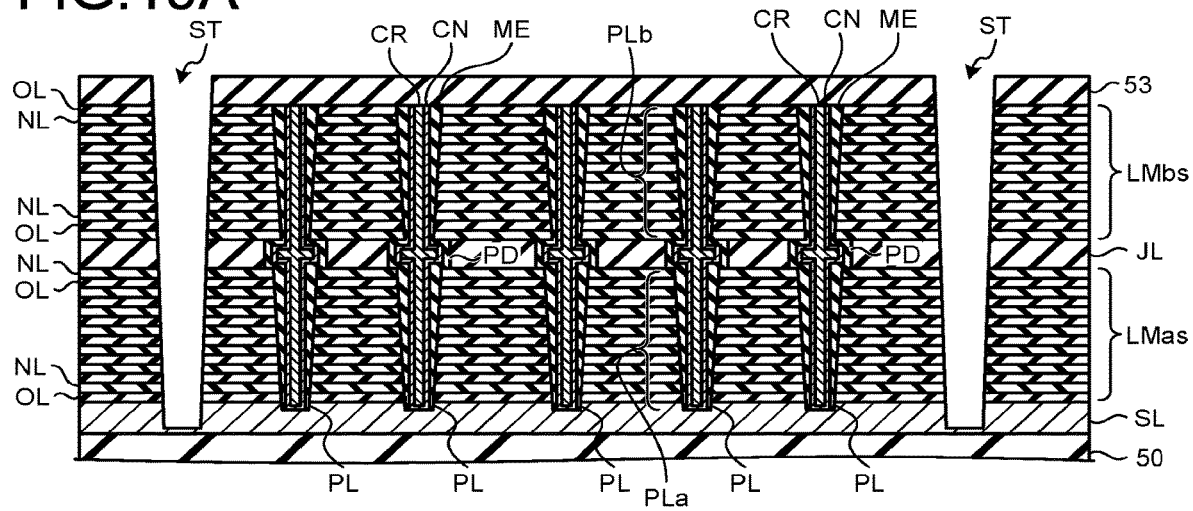
FIGS. 19A to 19C are cross-sectional views illustrating an example of the procedure of the method for manufacturing a semiconductor storage device according to the embodiment.
Figure 19B:
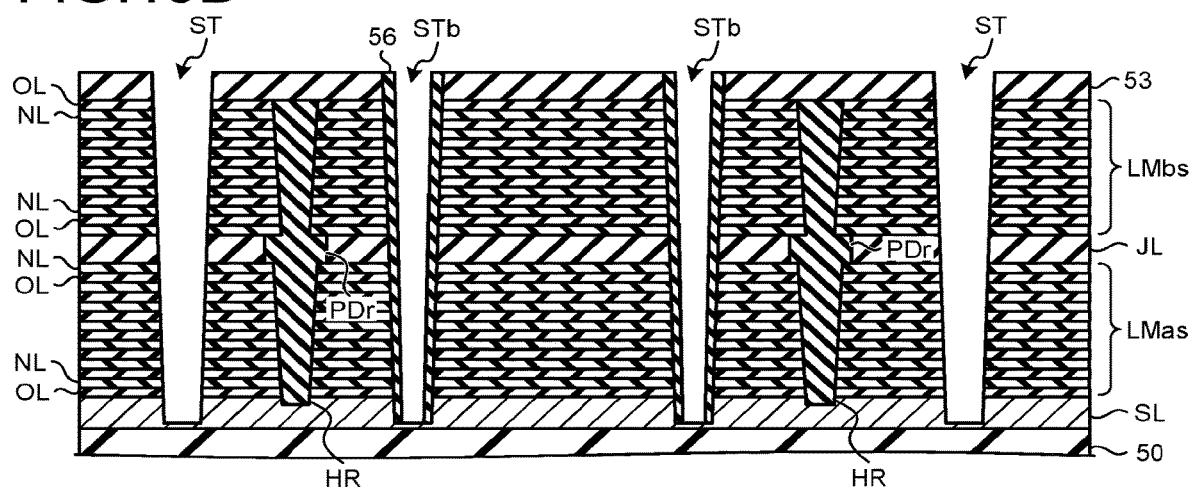
Figure 19C:
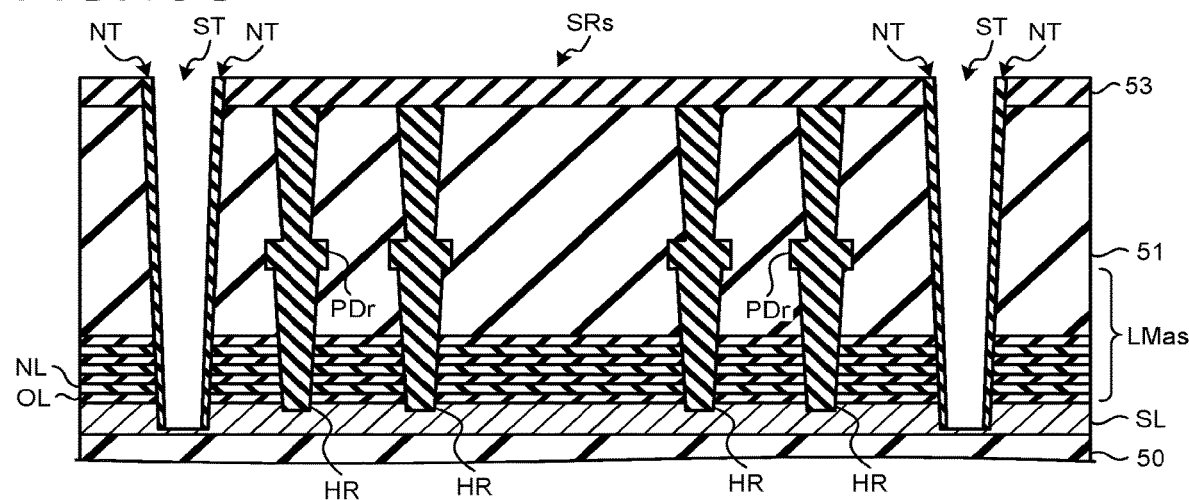
Figure 20A:
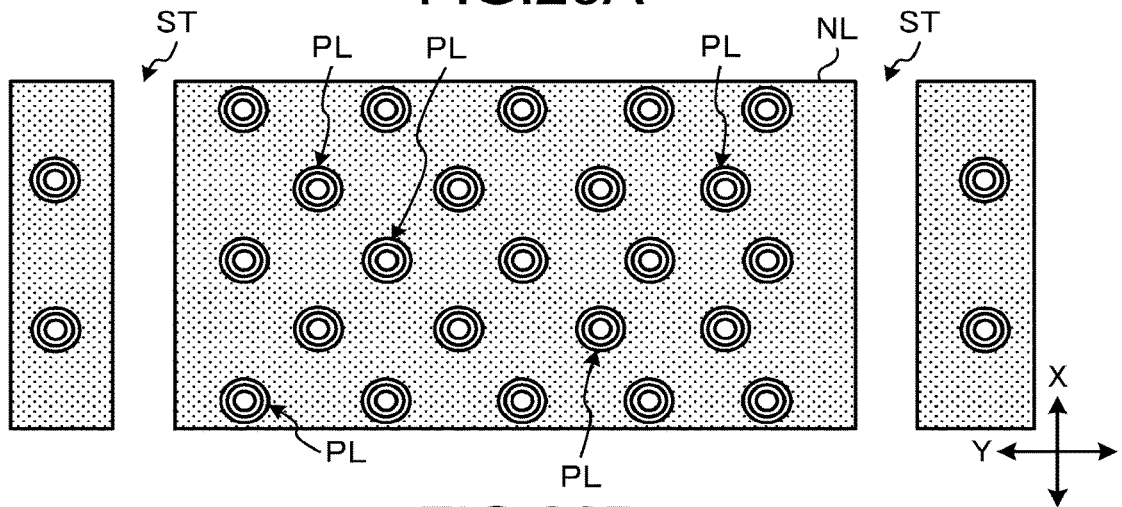
FIGS. 20A to 20C are lateral cross-sectional views illustrating an example of the procedure of the method for manufacturing a semiconductor storage device according to the embodiment.
Figure 20B:
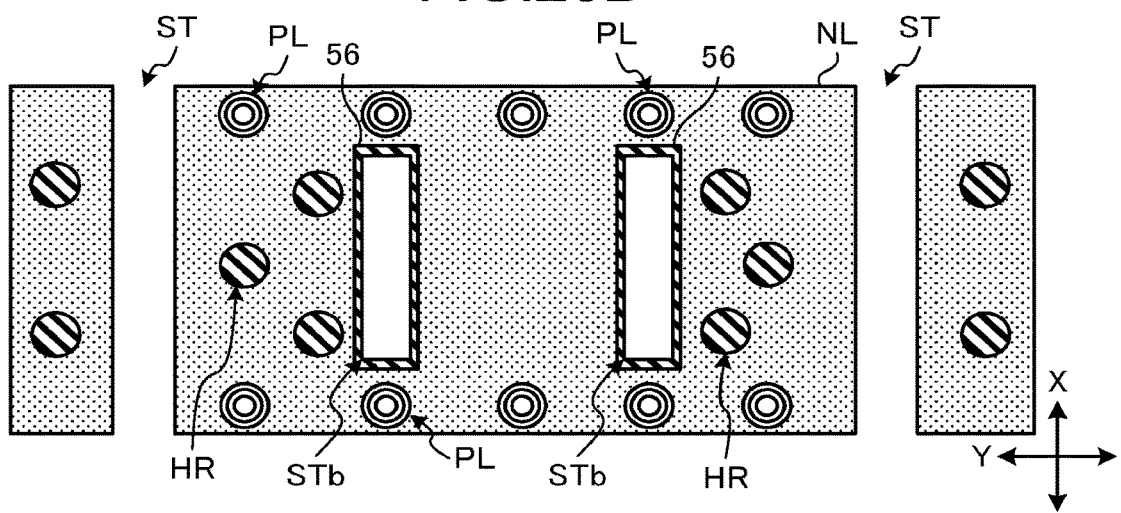
Figure 20C:
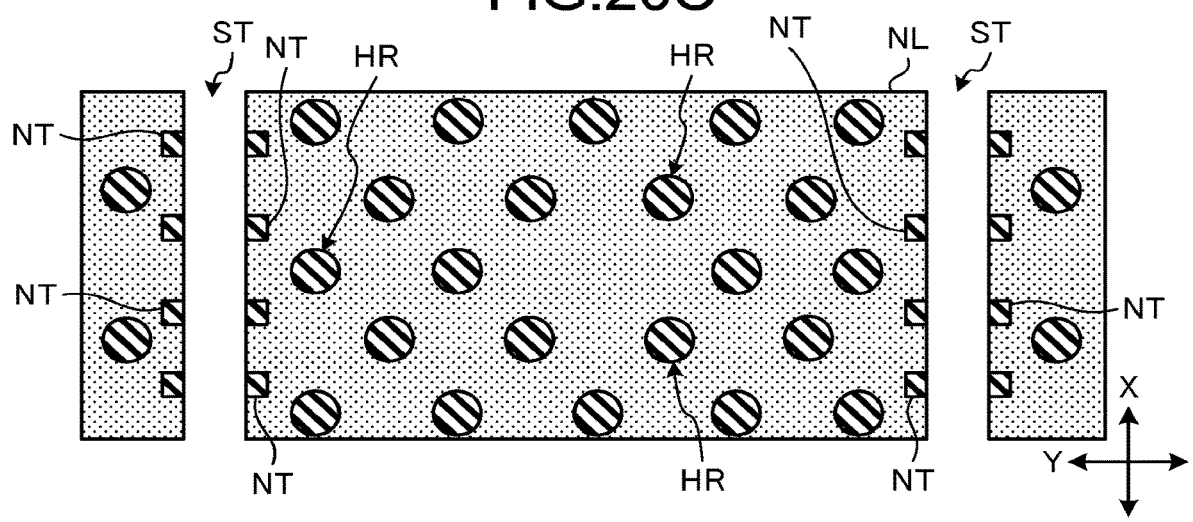

As illustrated in FIGS. 17B and 18B, since the slit STb is used for forming the penetrating contact region OXB, an insulating layer 56 such as the $SiO_2$ layer is formed on the side wall surface of the slit STb.

At this time, as illustrated in FIG. 17A to FIG. 17C and FIG. 18A to FIG. 18C, the insulating layer 56 is also formed on the side wall surface of the slit ST. In the stair portion SRs, the insulating layer 56 is also filled in the depression NTt on the side surface of the slit ST.

As illustrated in FIGS. 19A to 19C and FIGS. 20A to 20C, since the slit ST is used to replace the insulating layer NL with the word line WL, the insulating layer 56 on the side wall surface of the slit ST is removed.

At this time, the slit STb is protected by the mask or the like (not illustrated) so that the insulating layer 56 in the slit STb is not removed. At this time, the insulating layer 56 in the depression NTt of the slit ST can remain by performing the processing corresponding to a time period for which the insulating layer 56 on the side surface of the slit ST can be removed. As a result, the projection NT is formed on the side surface of the slit ST.

As illustrated in FIGS. 21A to 21C and FIGS. 22A to 22C, the insulating layers NL in the stacked portions LMas and LMbs are removed via the slit ST penetrating the stacked portions LMas and LMbs. As a result, stacked portions LMag and LMbg in which a gap is formed between the respective insulating layers OL are formed.

Figure 21A:
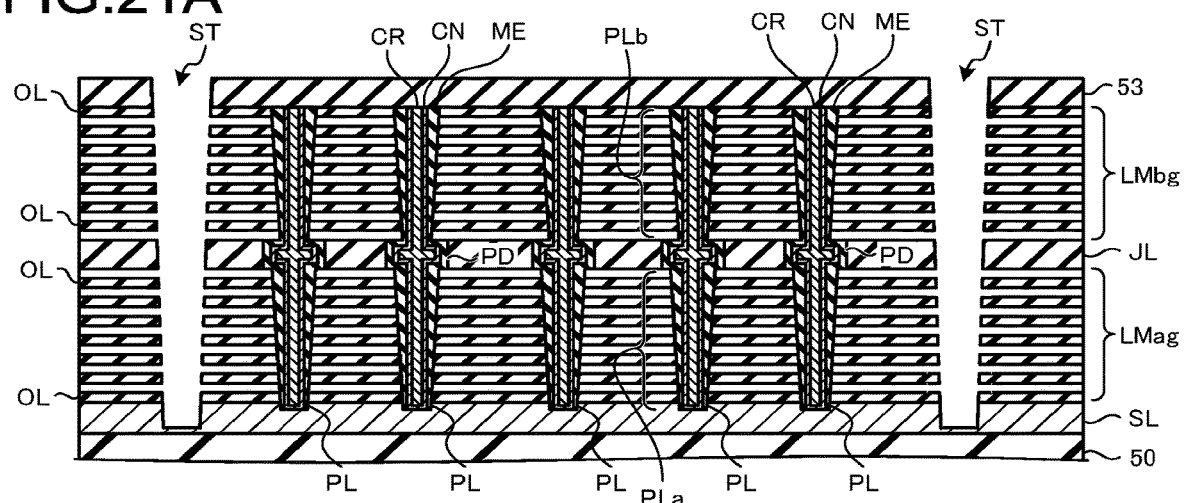
FIGS. 21A to 21C are cross-sectional views illustrating an example of the procedure of the method for manufacturing a semiconductor storage device according to the embodiment.
Figure 21B:
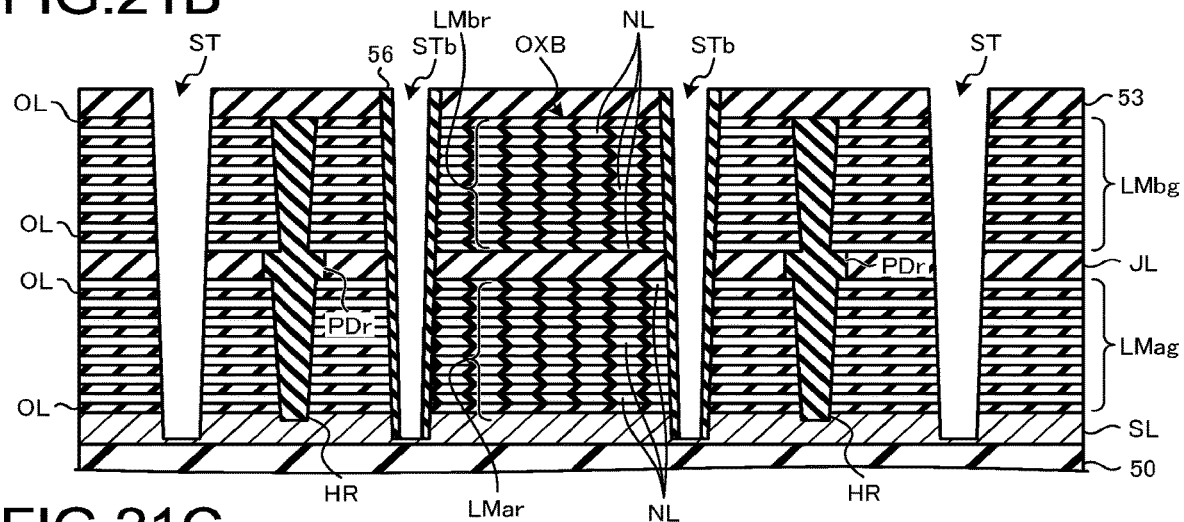
Figure 21C:
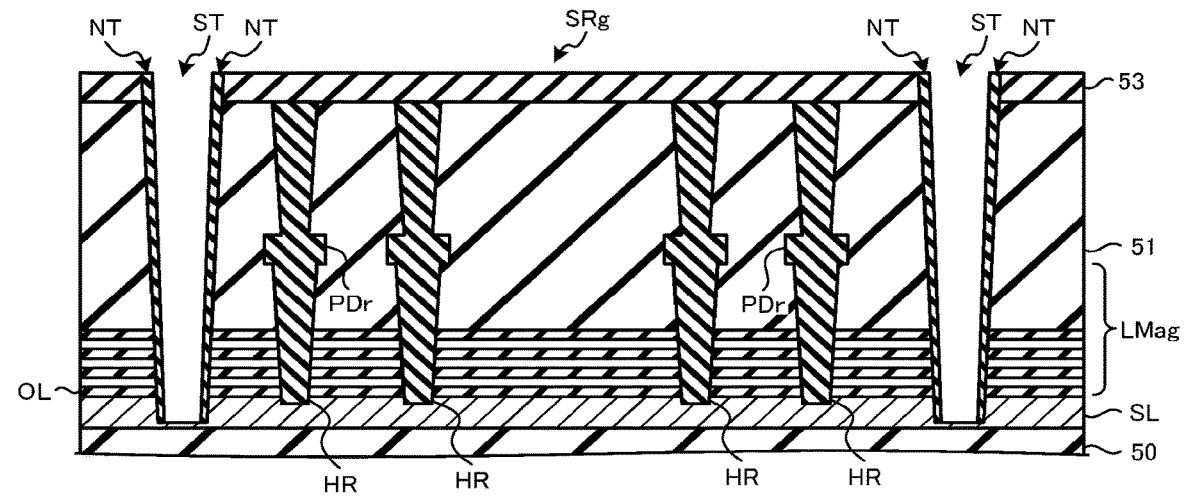
Figure 22A:
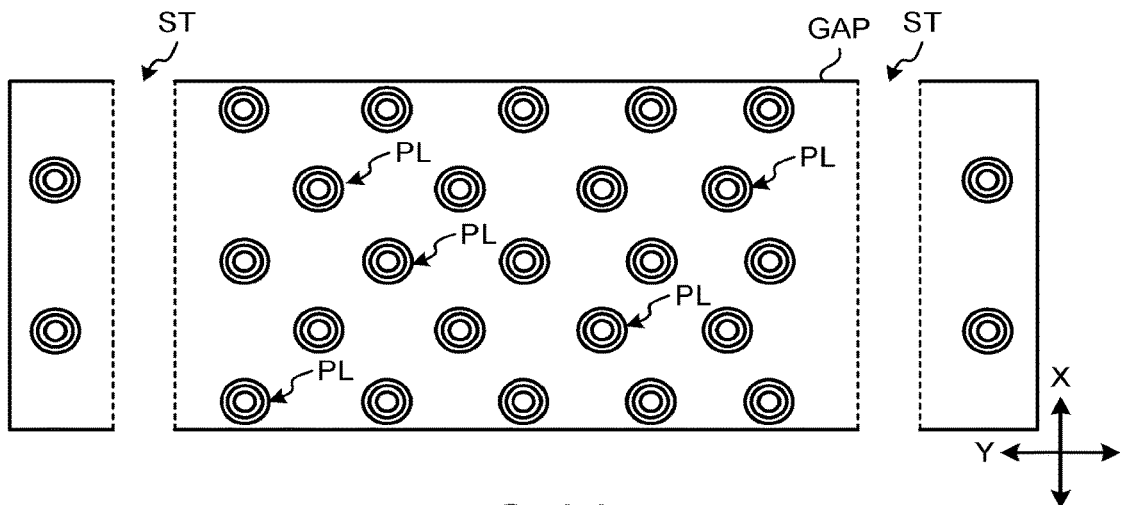
FIGS. 22A to 22C are lateral cross-sectional views illustrating an example of the procedure of the method for manufacturing a semiconductor storage device according to the embodiment.
Figure 22B:
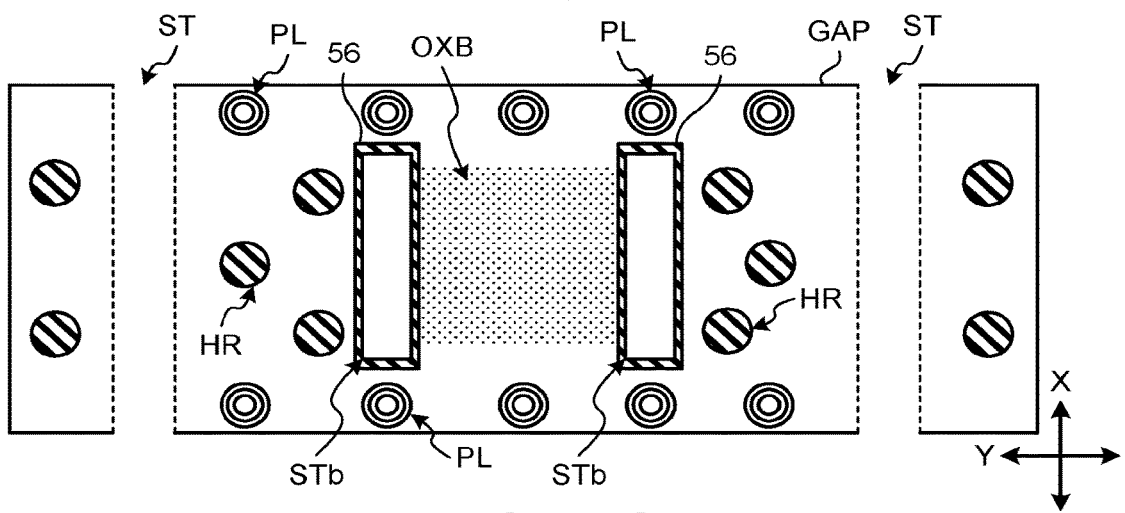
Figure 22C:
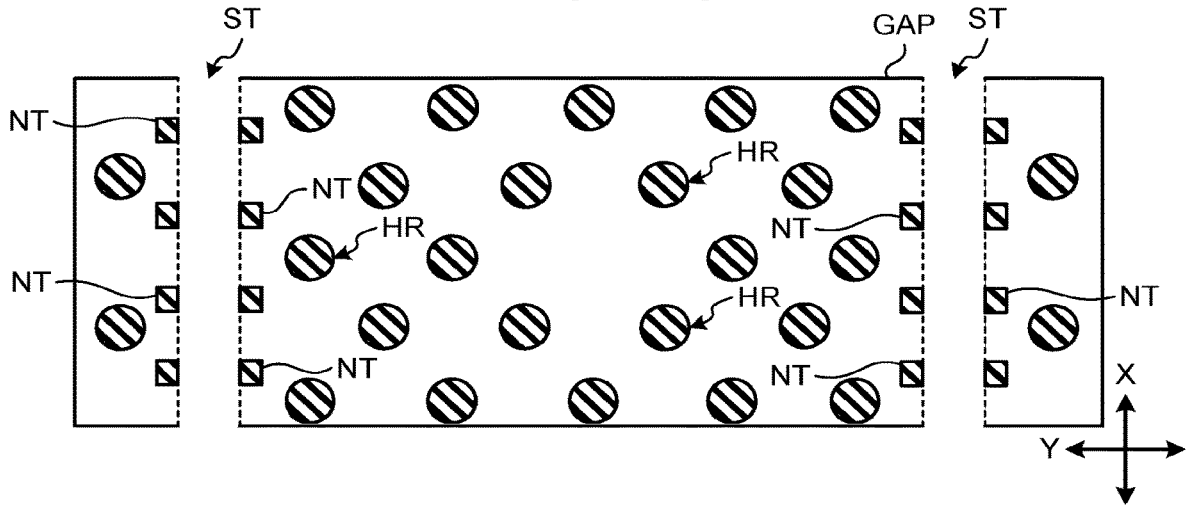

At this time, as illustrated in FIGS. 21B and 22B, in these regions, the slit STb having the insulating layer 56 on the side wall surface blocks a chemical solution or the like, which flows in from the slit ST, to remove the insulating layer NL, from flowing in a region sandwiched between the slits STb. Then, by stopping the processing before the chemical solution bypasses the slit STb (from the X direction) and flows into the region, the insulating layer NL remains in the region between the two slits STb without being removed.

As a result, the penetrating contact region OXB having the stacked portions LMar and LMbr is formed substantially near the center of the regions illustrated in FIGS. 21B and 22B.

Figure 23:
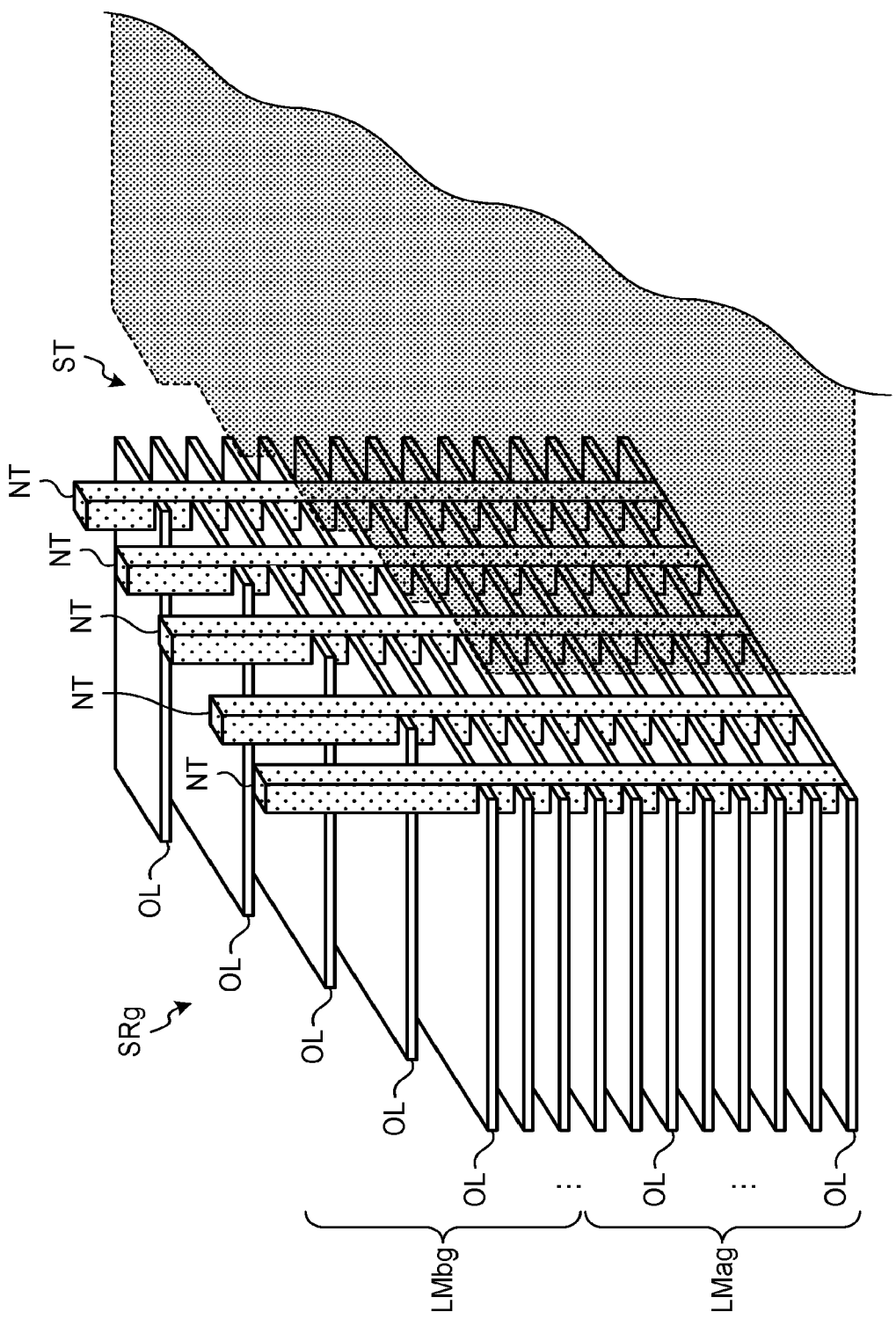
FIG. 23 is a perspective cross-sectional view illustrating an example of the procedure of the method for manufacturing a semiconductor storage device according to the embodiment.

At this time, the stacked portions LMag and LMbg, which are a fragile structure having a gap are supported by the pillar PL at the position illustrated in FIG. 21A and are supported by the columnar portion HR at the position illustrated in FIG. 21B. Further, in a stair portion SRg having a gap such as the position illustrated in FIG. 21C, the columnar portion HR and the projection NT on the side surface of the slit ST support the stacked portions LMag and LMbg. FIG. 23 illustrates an aspect in which the stair portions SRg of the stacked portions LMag and LMbg are supported by the projection NT.

FIG. 23 is a perspective cross-sectional view illustrating a part of the stair portion SRg of the semiconductor storage device 1 which is being manufactured. FIG. 23 is a perspective view of a half region on one side region in foreground of FIG. 23 in the regions on both sides facing each other with the slit ST sandwiched therebetween in order to visually recognize the side wall portion of the stair portion SRg facing the slit ST.

As illustrated in FIG. 23, the plurality of projections NT are arranged on the side surface of the slit ST at predetermined intervals. The chemical solution or the like for removing the insulating layer NL passes through the projection NT from the slit ST and flows in the stacked portions LMas and LMbs.

Further, the plurality of projections NT project outward on the side surface of the slit ST and are fitted in end portions of the stacked portions LMag and LMbg facing the slit ST.

As a result, the projection NT supports an end portion of the insulating layer OL closer to the slit ST when a gap is generated between the upper and lower insulating layers OL during and after removing the insulating layer NL.

As illustrated in FIGS. 24A to 24C and FIGS. 25A to 25C, the gap in the stacked portions LMag and LMbg is filled with the conductive material via the slit ST penetrating the stacked portions LMag and LMbg. As a result, stacked portions LMa and LMb in which the word line WL is formed between the respective insulating layers OL are formed.

Figure 24A:
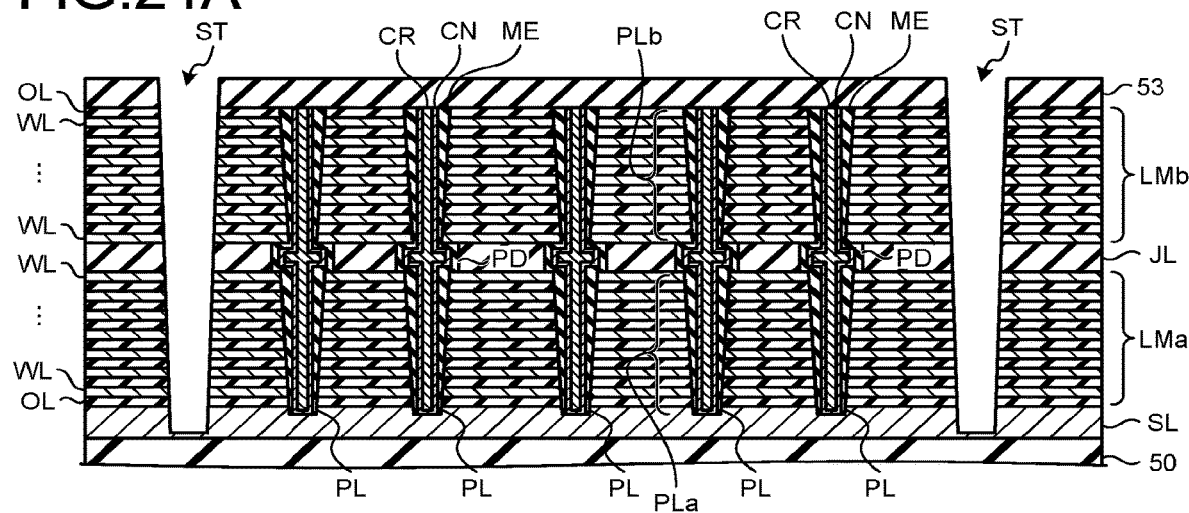
FIGS. 24A to 24C are cross-sectional views illustrating an example of the procedure of the method for manufacturing a semiconductor storage device according to the embodiment.
Figure 24B:
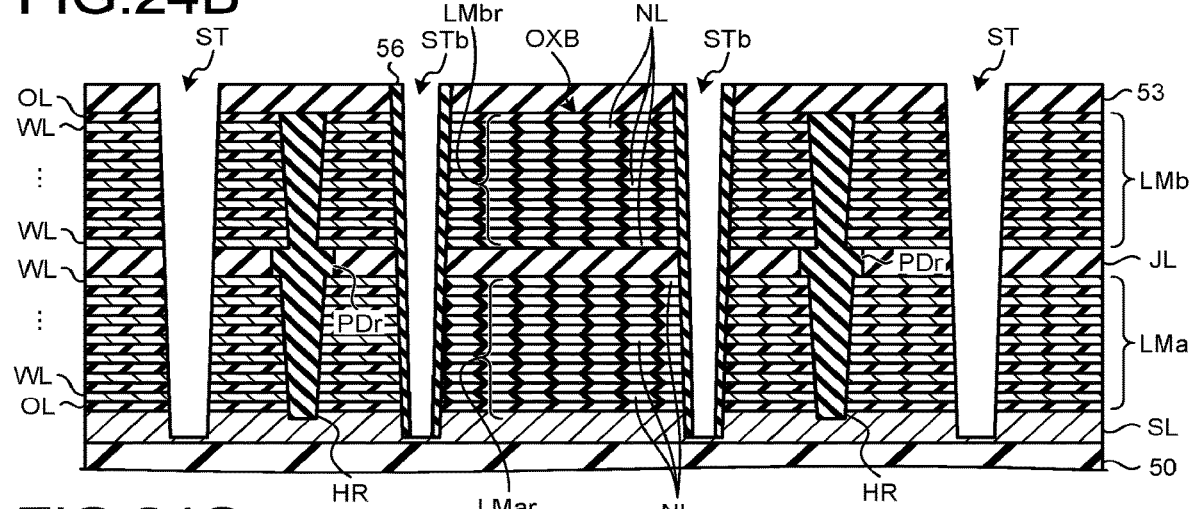
Figure 24C:
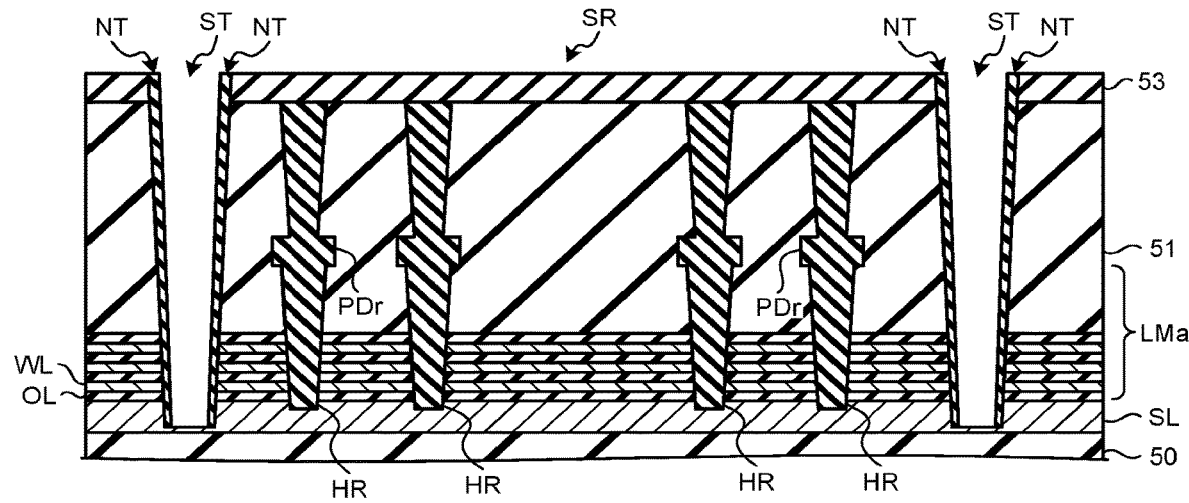
Figure 25A:
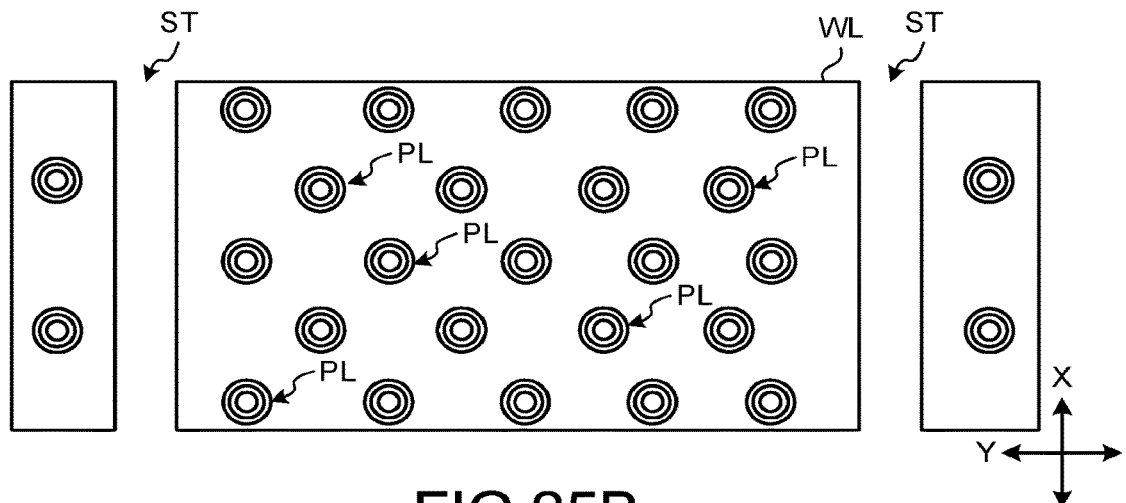
FIGS. 25A to 25C are lateral cross-sectional views illustrating an example of the procedure of the method for manufacturing a semiconductor storage device according to the embodiment.
Figure 25B:
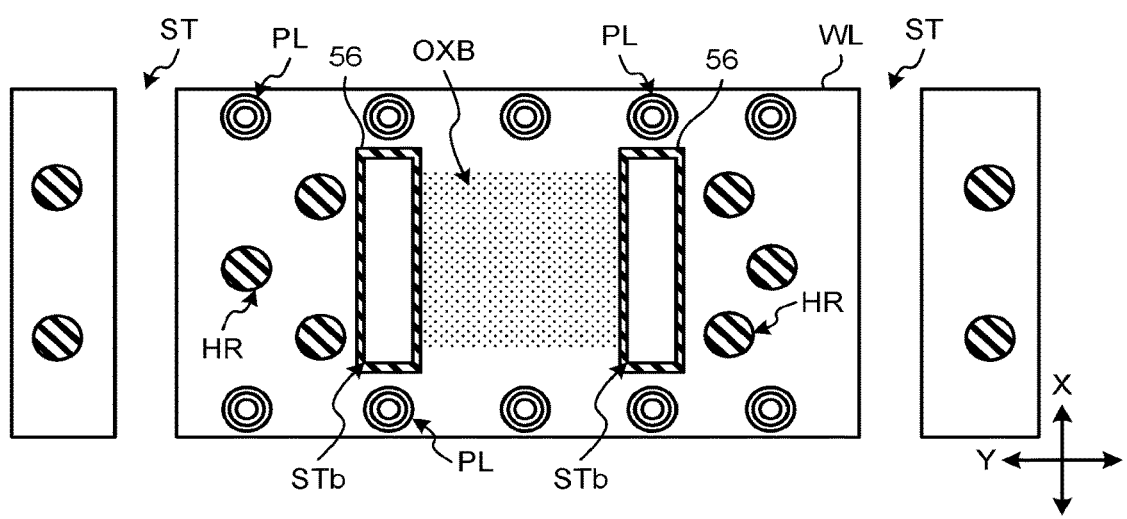
Figure 25C:
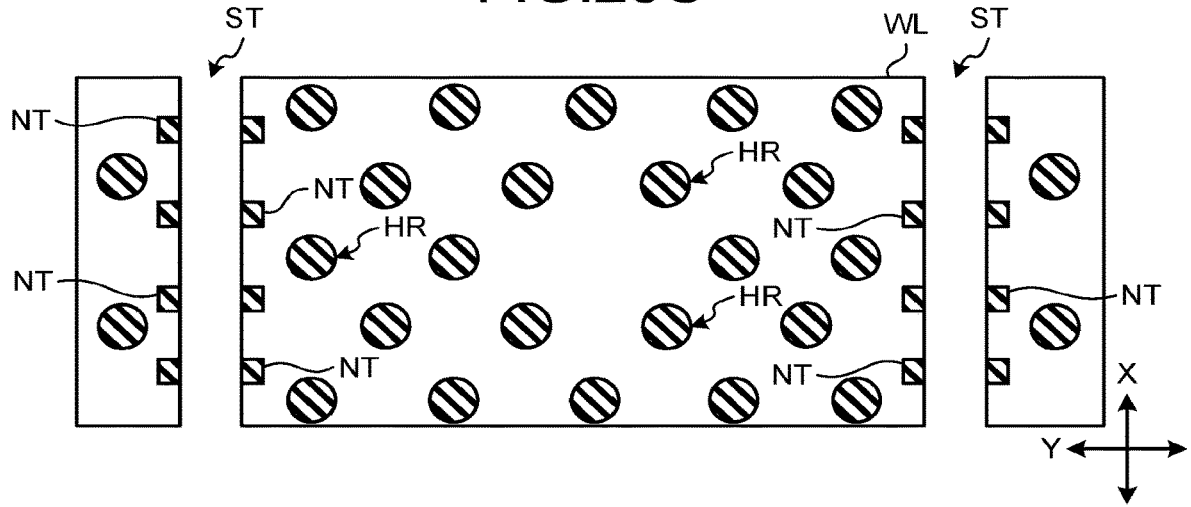

Even at this time, as illustrated in FIGS. 24B and 25B, the inflow of the gas for depositing the conductive layer such as the tungsten layer into the penetrating contact region OXB is blocked by the slit STb, so the state of the stacked portions LMar and LMbr having the insulating layer NL in the penetrating contact region OXB is maintained.

As illustrated in FIGS. 21A to 25C, the processing of replacing the insulating layer NL with the word line WL may be called replacement.

Figure 26:
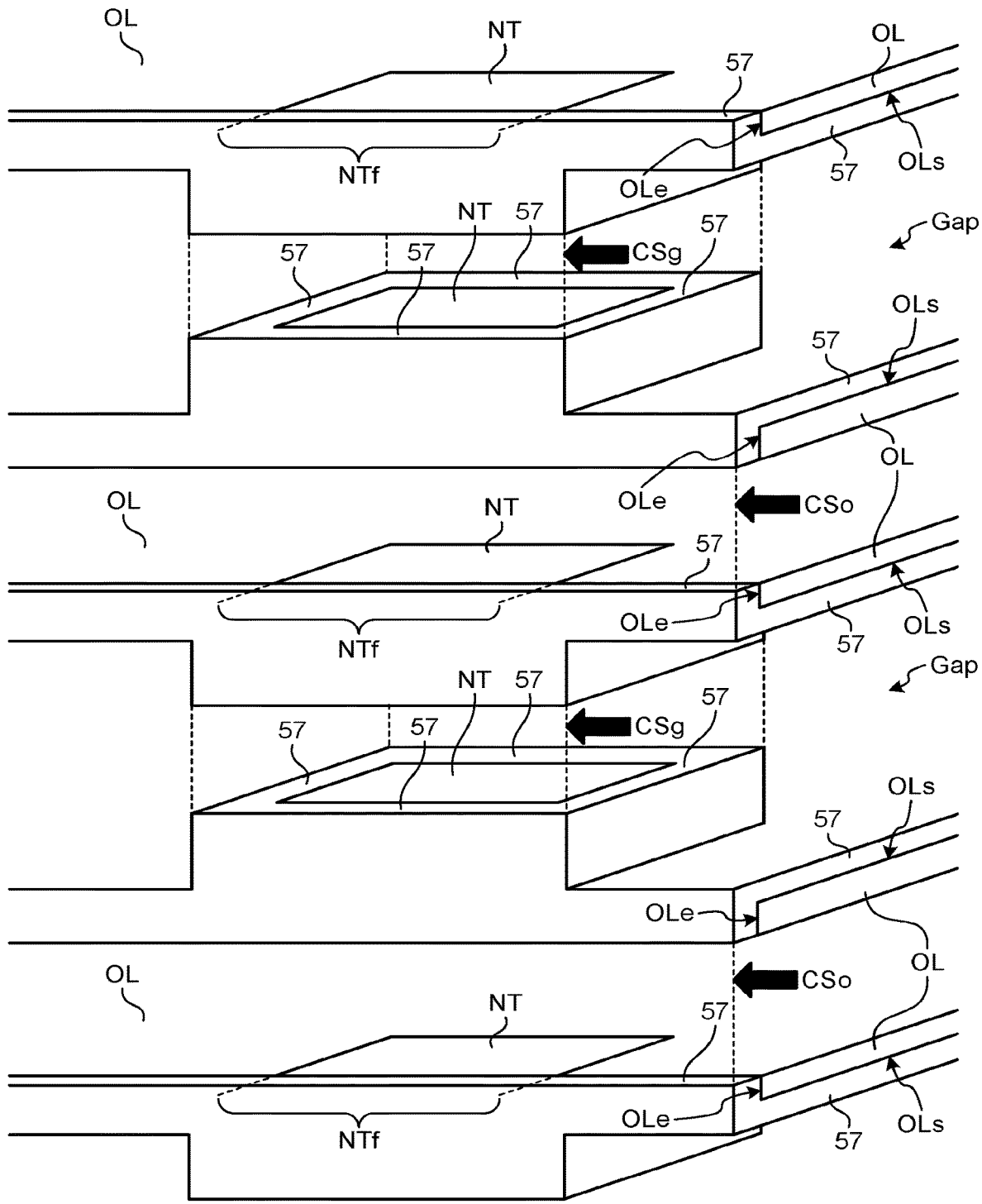
FIG. 26 is a perspective cross-sectional view illustrating an example of the procedure of the method for manufacturing a semiconductor storage device according to the embodiment.

Note that at the time of replacement, the metal element-containing block layer 57, which is a metal oxide layer such as an $Al_2O_3$ layer, may be formed before the processing of forming the word lines WL illustrated in FIGS. 24A to 24C and FIGS. 25A to 25C. FIG. 26 illustrates the aspect.

FIG. 26 is a perspective cross-sectional view illustrating an example of the procedure of the method for manufacturing a semiconductor storage device 1 according to the embodiment. FIG. 26 illustrates a cross section of the insulating layer OL in a layer thickness direction, a lateral cross section CSo at positions of each insulating layer OL, and a lateral cross section CSg at the gap position between the insulating layers OL.

As illustrated in FIG. 26, the metal element-containing block layers 57 are formed on, for example, both surfaces OLs of each insulating layer OL exposed toward gaps in the stacked portions LMag and LMbg, and an end surface OLe of each insulating layer OL exposed toward the slit ST.

At this time, the metal element-containing block layers 57 are formed on the surface of the insulating layer 56 of the projection NT closer to the slit ST continuously in the stacking direction of the stacked portions LMag and LMbg so as to close a frontage NTf of the projection NT facing the slit ST. In addition, at the gap position between the insulating layers OL, the metal element-containing block layer 57 is formed so as to surround not only the frontage NTf of the projection NT but also the circumference of the projection NT.

Figure 27:
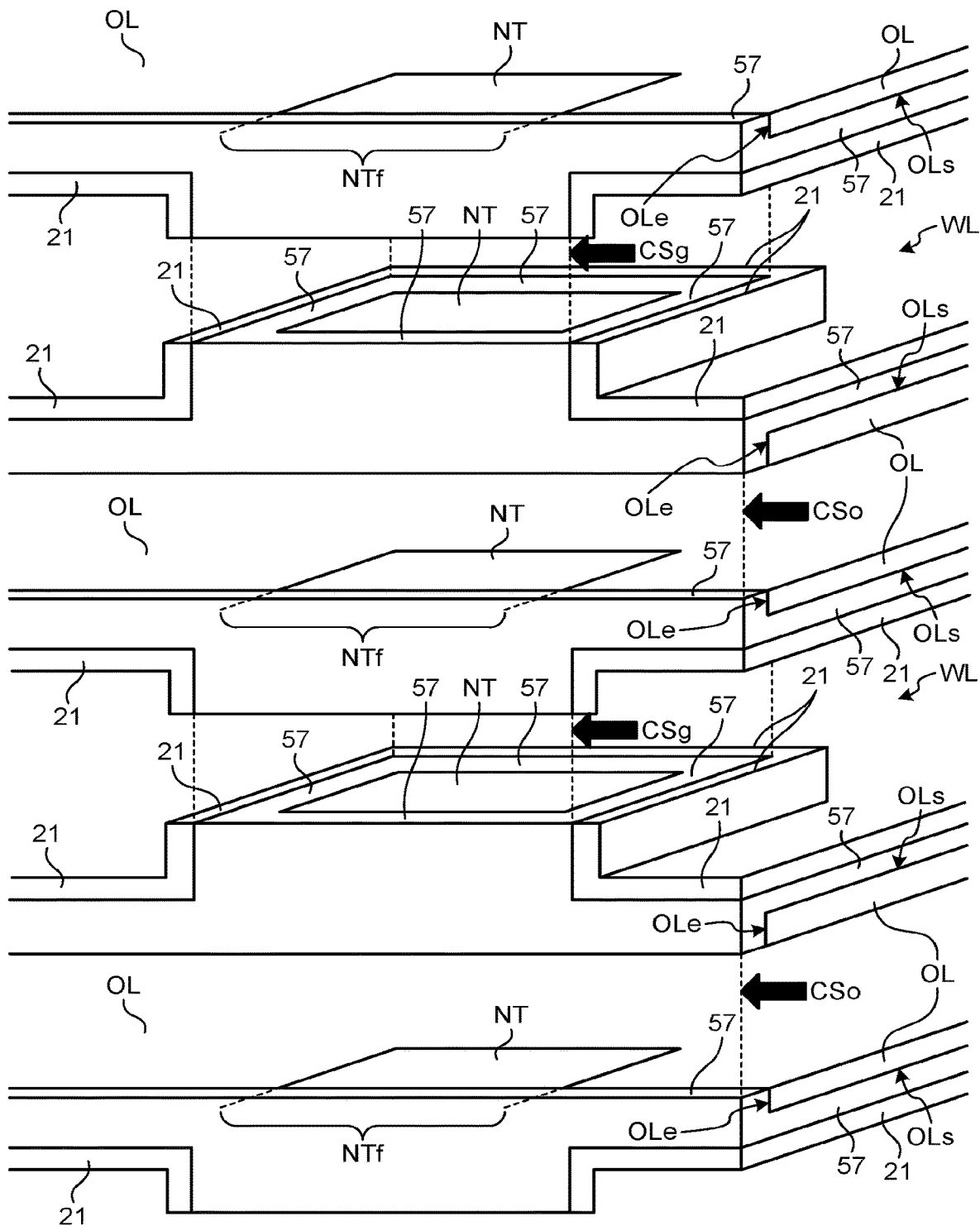
FIG. 27 is a perspective cross-sectional view illustrating an example of the procedure of the method for manufacturing a semiconductor storage device according to the embodiment.

Further, after the formation of the metal element-containing block layer 57 illustrated in FIG. 26 and before the processing of forming the word line WL illustrated in FIGS. 24A to 24C and FIGS. 25A to 25C, a barrier metal layer 21 such as a TiN layer is formed. The barrier metal layer 21 is formed at substantially the same position as the formation position of the metal element-containing block layer 57 on the insulating layers 56 and OL so as to cover the metal element-containing block layer 57 described above. However, the barrier metal layers 21 formed on the surface of the insulating layer 56 of the projection NT closer to the slit ST and the end surfaces OLe of each insulating layer OL facing the slit ST are removed together with the word line WL formed in the slit ST after the processing of forming the word line WL by the replacement processing. After the barrier metal layer 21 is removed, the metal element-containing block layers 57 may remain on the surface of the insulating layer 56 closer to the slit ST and on the end surfaces OLe of each insulating layer OL facing the slit ST. FIG. 27 illustrates the aspect.

FIG. 27 is a perspective cross-sectional view illustrating an example of the procedure of the method for manufacturing a semiconductor storage device 1 according to the embodiment. FIG. 27 illustrates a cross section of the insulating layer OL in the layer thickness direction, the lateral cross section CSo at positions of each insulating layer OL, and the lateral cross section CSg at the word line WL position between the insulating layers OL. Note that the word line WL is omitted.

As illustrated in FIG. 27, the barrier metal layers 21 are formed on the metal element-containing block layers 57 formed on both surfaces OLs of the insulating layer OL.

On the other hand, the metal element-containing block layers 57 are formed on the surface of the insulating layer 56 of the projection NT closer to the slit ST and the end surfaces OLe of each insulating layer OL facing the slit ST continuously in the stacking direction of the stacked portions LMag and LMbg, whereas the barrier metal layer 21 is removed from these surfaces. However, at a position of the word line WL between the insulating layers OL, the barrier metal layer 21 remains at least at the tip of the projection NT projects outside the slit ST and facing the end surface of the word line WL, that is, on the back side of FIG. 27. The barrier metal layer 21 may connect between the frontage NTf of the projection NT facing the slit ST and the tip of the projection NT facing the end surface of the word line WL, and may remain in a part or the whole of both side surfaces of the projection NT.

Thereafter, the inside of the slit STb is filled with the insulating layer to form the plate-like portion BR. Further, the insulating layer 52 is formed on the side wall of the slit ST, and the conductive layer 20 is filled therein to form the contact LI. Further, the contact CC penetrating the insulating layers 53 and 51 and reaching the uppermost word line WL of each stage of the stair portion SR is formed. In addition, the contact C4 that penetrates the insulating layer 53, the stacked portions LMar and LMbr, and the source line SL, and is electrically connected to the transistor TR and the like of the peripheral circuit CUA is formed.

In addition, after forming the insulating layer 54 covering the insulating layer 53 of the memory portion MR and the stair portion SR, the plug CH that penetrates the insulating layers 54 and 53 and is connected to the channel CN of the pillar PL and the plug VO that penetrates the insulating layer 54 and is connected to each contact LI, CC, and C4 are formed. In addition, the upper layer wiring or the like connected to these plugs CH and VO is formed.

Figure 17C:
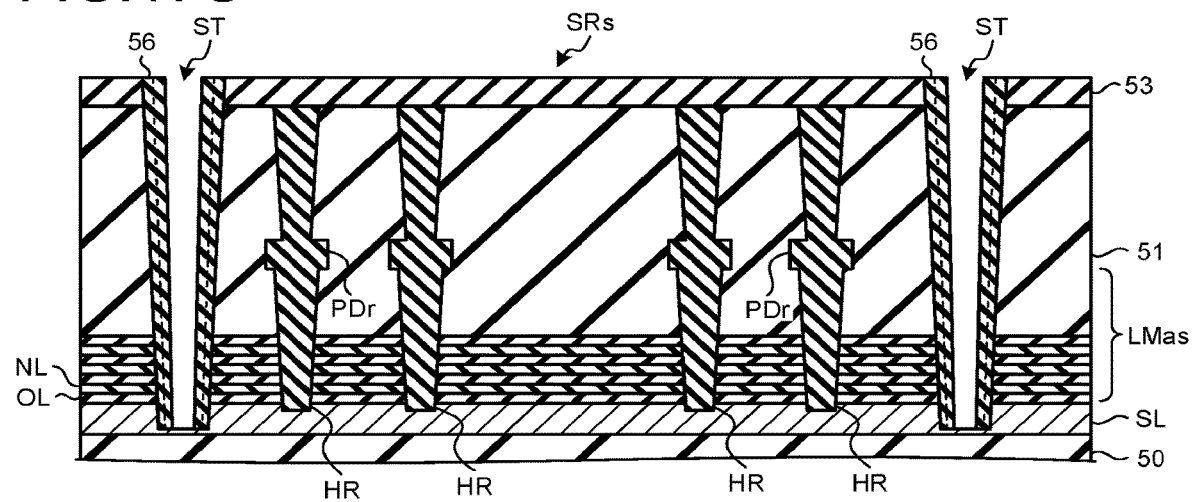

Note that as described above, the projection NT has the insulating layer 56 by the processing of FIGS. 17A to 17C and the like, and the insulating layer 52 of the contact LI is formed by the subsequent processing. In this way, the insulation material of the projection NT and a liner of the contact LI in contact with the projection NT are separate members. Therefore, an interface between the projection NT and the liner of the contact LI may be observable by any means.

Further, as described above, in the replacement processing, when the metal element-containing block layer 57 is formed, it is easier to identify the insulating layers 52 and 56, and by interposing the metal element-containing block layer 57 between the insulating layers 52 and 56, it is possible to determine that the insulating layer 56 is formed before the replacement processing and the insulating layer 52 is formed after the replacement processing, for example.

As described above, the semiconductor storage device 1 according to the embodiment is manufactured.

Figure 28A:
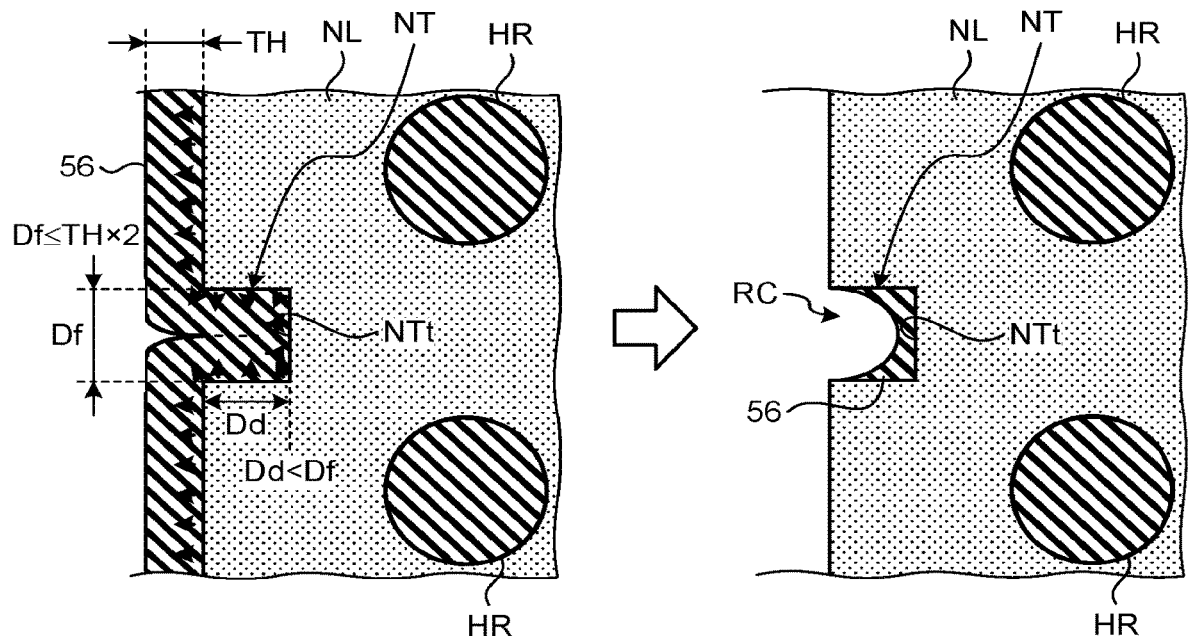
FIGS. 28A and 28B are enlarged lateral cross-sectional views of a vicinity of the projection during manufacturing the semiconductor storage device according to the embodiment.
Figure 28B:
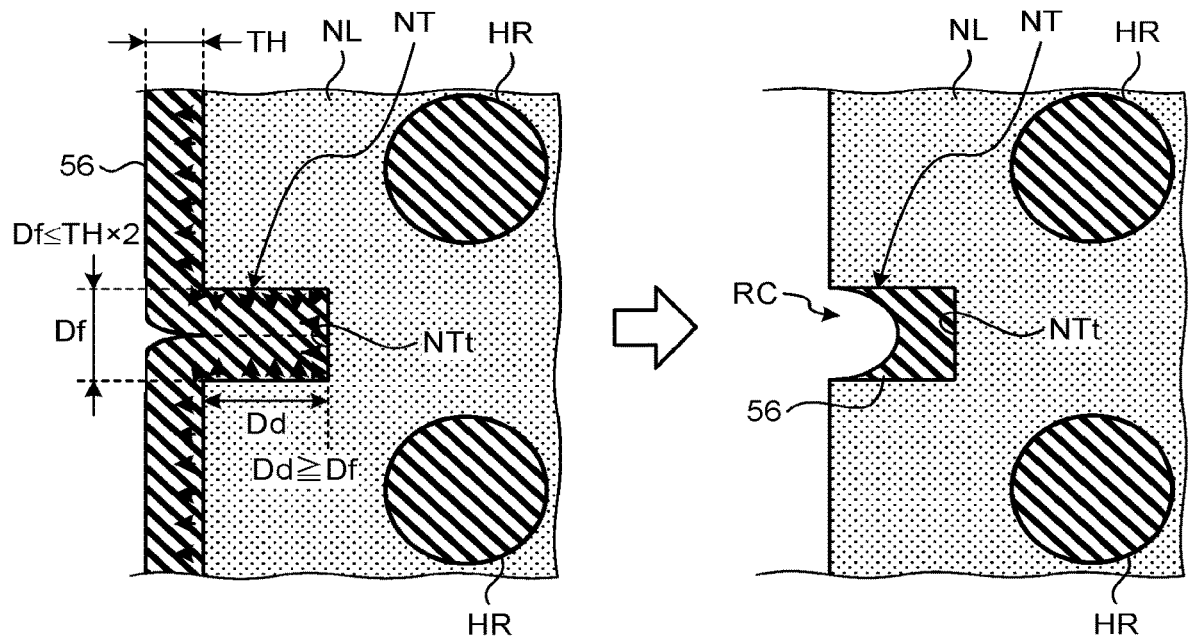

Here, the shape of the projection NT included in the contact LI will be described in more detail with reference to FIGS. 28A and 28B and FIGS. 29A to 29C. FIG. 28 is an enlarged cross-sectional view of the vicinity of projection NT during manufacturing the semiconductor storage device 1 according to the embodiment. The left diagrams of FIGS. 28A and 28B illustrate an aspect near the projection NT in the processing of FIGS. 17A to 17C and FIGS. 18A to 18C described above. The right diagrams of FIGS. 28A and 28B illustrate an aspect near the projection NT in the processing of FIGS. 19A to 19C and FIGS. 20A to 20C described above.

As illustrated on the left side of FIG. 28A, when the lateral cross section of the projection NT is formed in, for example, a rectangular shape, the insulating layer 56 is formed from the side surface of the slit ST and each surface of a crank-shaped depression NTt in a direction substantially perpendicular to these surfaces. An arrow attached inside the insulating layer 56 in FIG. 28A indicates a growth direction of the insulating layer 56.

The insulating layer 56 is formed to a desired thickness so that the slit STb is used for forming the penetrating contact region OXB. For use in forming the penetrating contact region OXB, the slit STb may have a very thin insulating layer 56 on the side surface thereof. The insulating layer 56 having the same thickness as that of the slit STb is formed on the side surface of the slit ST.

At this time, in the depression NTt, the insulating layers 56 are each formed from two surfaces of the depression NTt facing each other in the X direction, and for example, the insulating layers 56 having a thickness twice that of the side surface of the slit ST are formed in the X direction. In order to fill the depression NTt with the insulating layer 56 almost completely, the width of the depression NTt in the X direction, and more specifically, the width Df of the frontage of the depression NTt opened toward the slit ST is twice the desired thickness TH or less of the insulating layer 56 on the side surface of the slit ST. (Df≤TH×2). As a result, the inside of the depression NTt can be almost completely filled with the insulating layer 56.

Due to the above conditions, the cross sectional area of the depression NTt is smaller than the cross sectional area of the columnar portion HR and the pillar PL, for example, at the same height position in the stacked portions LMas and LMbs.

As illustrated on the right side of FIG. 28A, when the insulating layer 56 is removed from the side surface of the slit ST, a recess RC may be generated in the insulating layer 56 in the depression NTt. As described above, the insulating layer 56 in the depression NTt has a role of supporting the stacked portions LMag and LMbg in the replacement processing, so even when the recess RC is generated, the insulating layer 56 in the depression NTt preferably has a predetermined thickness and strength.

As illustrated on the left side of FIG. 28B, by increasing the depth of the depression NTt, that is, the projection width Dd of the depression NTt to the stacked portions LMas and LMbs, as illustrated on the right side of FIG. 28B, it is possible to maintain the thickness and strength of the insulating layer 56 in the depression NTt even when the recess RC is generated. That is, for example, the case of FIG. 28B where the projection width Dd of the depression NTt≥the width Df of the frontage of the depression NTt is better than for example, the case of FIG. 28A where the projection width Dd of the depression NTt<the width Df of the frontage of the depression NTt.

However, if the projection width Dd of the depression NTt increases with respect to the width Df of the frontage of the depression NTt, it becomes difficult to fill the insulating layer 56 in the depression NTt. Therefore, it is preferable to adjust the width Df of the frontage of the depression NTt and the projection width Dd of the depression NTt within the range where the inside of the depression NTt is almost completely filled with the insulating layer 56.

Figure 29A:
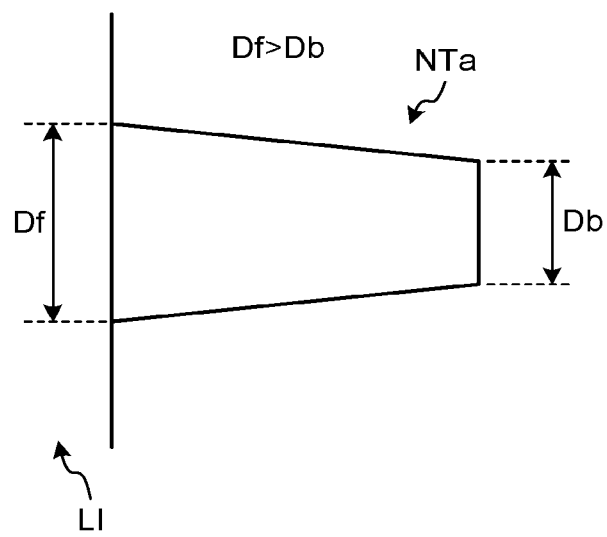
FIGS. 29A to 29C are diagrams illustrating an example of a shape of a lateral section of the projection that can be applied to the semiconductor storage device according to the embodiment.
Figure 29B:
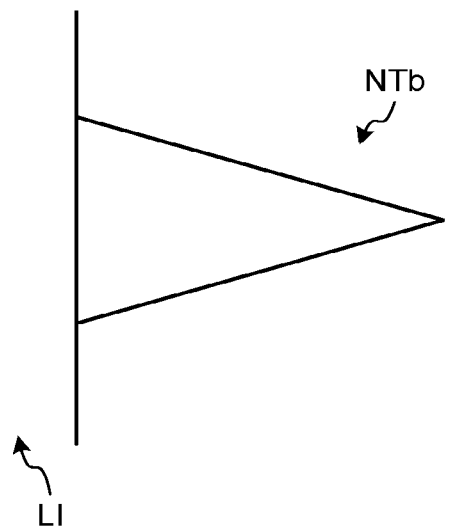
Figure 29C:
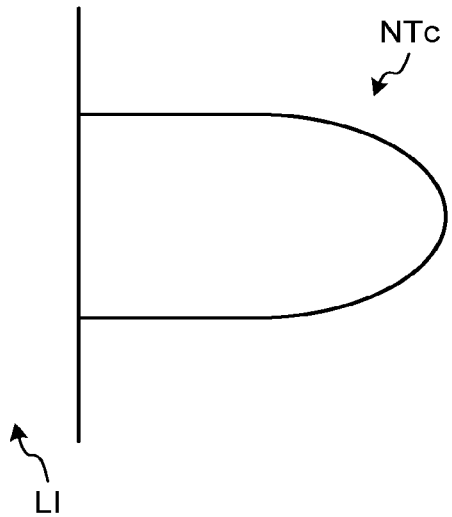

FIGS. 29A to 29C are diagrams illustrating an example of a shape of the lateral cross section of the projection NT that can be applied to the semiconductor storage device 1 according to the embodiment. As illustrated in FIGS. 29A to 29C, instead of adjusting the width Df of the frontage of the depression NTt and the projection width Dd of the depression NTt, or in addition, it is possible to variously change the shape of the lateral cross section of the projection NT to easily fill the insulating layer 56 in the depression NTt.

As illustrated in FIG. 29A, if the width Db of the projection NTa at the tip is made smaller than the width Df of the frontage of the projection NTa, the embedability of the insulating layer 56 is improved.

As illustrated in FIG. 29B, if the tip of the projection NTb is set to have an acute angle, the embedability of the insulating layer 56 is further improved.

As illustrated in FIG. 29C, the embedability of the insulating layer 56 is also improved by making the projection NTc a lateral cross section shape having a curved surface.

As described above, from the viewpoint of the embedability of the insulating layer 56, the shape of the lateral cross section of the projection NT can be not only a substantially rectangular shape but also various polygonal shapes such as a trapezoid or a triangle, and can have a U-letter shape without a corner portion, and the like.

In the manufacturing process of the semiconductor storage device such as a three-dimensional non-volatile memory, if the sacrificing layer is removed for replacement, the stacked body becomes fragile. Therefore, the columnar portion that supports the stacked body may be arranged in the stair portion or the like.

In this case, the portion of each layer facing the slit may be in a state like a cantilever where only one side thereof is supported by the columnar portion closest to the slit, and the bending may occur. In order to suppress such bending, it is preferable to arrange the columnar portion as close to the slit as possible.

However, there is a risk that the columnar portion and the slit may come into contact with each other due to the misalignment or the like, and therefore, for example, there is a limit to make the columnar portion closer to the slit beyond the accuracy of the misalignment.

According to the semiconductor storage device 1 of the embodiment, the contact LI of the stair portion SR has the projection NT provided on the side surface thereof, with the projection NT extending along the stacking direction of the stacked portions LMa and LMb. The projection NT has the insulating layer 56 that continuously extends in the stacking direction of the stacked portions LMa and LMb across a plurality of word lines WL. By the insulating layer 56, it is possible to suppress the bending of the insulating layer OL in the portion facing the slit ST which will be the contact LI later during the replacement process, and to increase the strength of the stacked portions LMag and LMbg.

According to the semiconductor storage device 1 of the embodiment, the projection NT has the insulating layer 56. The insulating layer 56 is formed as a part of the step of forming the penetrating contact region OXB. As a result, the projection NT can be formed without adding any other processes.

According to the semiconductor storage device 1 of the embodiment, the cross sectional area of the projection NT is smaller than the cross sectional area of the columnar portion HR and the pillar PL at the same height positions in the stacked portions LMa and LMb. In this way, by making the projection NT small, the filling by the insulating layer 56 becomes easy.

According to the semiconductor storage device 1 of the embodiment, the width Db of the projection NT at the tip protruding outside the contact LI of the projection NT is smaller than the width Df of the frontage of the projection NT facing the slit ST. This makes the filling by the insulating layer 56 much easier.

According to the semiconductor storage device 1 of the embodiment, the lateral cross section of the projection NT can also be formed into a rounded U-shape. The shape of the projection NT also makes the filling by the insulating layer 56 much easier.

According to the semiconductor storage device 1 of the embodiment, the projection width Dd by which the projection NT projects outside the contact LI has a dimension equal to or larger than the width Df of the frontage of the projection NT facing the slit ST. As a result, when removing the insulating layer 56 from the side surface of the slit ST, even if the recess is generated in the insulating layer 56 of the projection NT, the insulating layer 56 having a thickness of sufficient strength to support the stacked portions LMag and LMbg during the replacement can remain.

According to the semiconductor storage device 1 of the embodiment, the projection NT is formed in an integrated shape in which the diameter is substantially discontinuously unchanged over the stacked portions LMa and LMb. As a result, unlike the pillar PL in which the upper and lower pillars PLa and PLb are connected to each other via the joined portion with an increased diameter and the column portion HR in which the upper and lower columnar portions HRa and HRb are connected to each other through the joined portion with an increased diameter, the strength of the projection NT increases, and as a result, it is possible to support the stacked portions LMag and LMbg more firmly.

According to the semiconductor storage device 1 of the embodiment, the plurality of projection NTs are regularly arranged along the X direction. As a result, the strength of the stacked portions LMag and LMbg in the X direction is kept uniform.

Other Modified Examples

In the above-described embodiment, the contact LI has the projection NT in the stair portion SR. However, the projections may be arranged on the side surface of the contact such as within the memory portion and between the memory portions.

In the above-described embodiment, the insulating layer is filled in the columnar portion HR. However, the process of filling the columnar portion and the pillar may be performed in parallel, and the columnar portion may be filled with the same material as the filler of the pillar.

In the above-described embodiment, the semiconductor storage device 1 has a 2 Tier (two-stage) structure including the two stacked portions LMa and LMb. However, the semiconductor storage device may have a structure of 1 Tier or 3 Tiers or more.

In the above-described embodiment, the semiconductor storage device 1 includes the stacked portions LMa and LMb above the peripheral circuits CUA arranged on the substrate SB. However, the stacked body of the semiconductor storage device including the memory portion and the stair portion may be arranged on the substrate in parallel with the peripheral circuit, or may be attached to the substrate on which the peripheral circuits are arranged. In this case, the semiconductor storage device may not have the penetrating contact region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a stacked body that includes a plurality of first conductive layers stacked with a first insulating layer interposed therebetween and has a stair portion in which end portions of the plurality of first conductive layers have a stair shape and a memory portion in which a plurality of memory cells are arranged;
a first pillar that extends in the stacked body in the memory portion in a stacking direction of the stacked body, the plurality of memory cells being formed at portions where the first pillar intersects with at least some of the plurality of first conductive layers;
a second pillar that extends in the stacked body in the stair portion in the stacking direction; and
a first structure that extends in the stacked body in the memory portion and the stair portion in the stacking direction and a first direction intersecting with the stacking direction and divides the stacked body, the first structure including a plurality of projections on a side surface thereof in the stair portion, the plurality of projections continuously extending in the stacking direction across the plurality of first conductive layers, wherein
the first structure includes:
a second insulating layer that is provided in the plurality of projections; and
a third insulating layer that covers end surfaces of the plurality of first conductive layers and the first insulating layer facing toward the first structure through positions of the plurality of projections and positions between adjacent projections while interposing the second insulating layer therebetween at the positions of the plurality of projections, and continuously extends in the first structure over the memory portion and the stair portion, and
a cross sectional area of each of the projections is smaller than a cross sectional area of the second pillar at a same height position in the stacking direction.

2. The semiconductor storage device according to claim 1, further comprising:
a fourth insulating layer that surrounds a circumference of the second insulating layer at a height position of each of the plurality of first conductive layers in the projections in the first structure, and is arranged on both sides of each of the plurality of first conductive layers in the stacking direction in the stacked body.

3. The semiconductor storage device according to claim 1, wherein the stacked body includes a first stacked portion and a second stacked portion that is arranged above the first stacked portion, the first pillar includes a first sub-pillar which is arranged in the first stacked portion, and a second sub-pillar which is arranged in the second stacked portion and is connected to the first sub-pillar via a portion with an increased diameter, and each of the projections is made into an integrated shape over the first stacked portion and the second stacked portion.

4. The semiconductor storage device according to claim 1, wherein the plurality of projections are regularly arranged along the first direction.

5. The semiconductor storage device according to claim 1, wherein the first structure includes the plurality of projections, which are arranged along the first direction, on both sides of the first structure in a width direction thereof, and the plurality of projections are arranged at positions opposite to each other on the both sides of the first structure in the width direction.

6. The semiconductor storage device according to claim 1, wherein each of the projections has a length in the first direction equal to or shorter than a length thereof in a direction intersecting with the stacking direction and the first direction.

7. The semiconductor storage device according to claim 1, wherein each of the projections has a length of an inside end portion in the first direction longer than a length of an outside end portion thereof in the first direction, the inside end portion being located inward the first structure and the outside end portion being located outs and the first structure in a direction intersecting with the stacking direction and the first direction.

8. A semiconductor storage device comprising:
a stacked body that includes a plurality of first conductive layers stacked with a first insulating layer interposed therebetween and has a stair portion in which end portions of the plurality of first conductive layers have a stair shape and a memory portion in which a plurality of memory cells are arranged;

a first pillar that extends in the stacked body in the memory portion in a stacking direction of the stacked body, the plurality of memory cells being formed at portions where the first pillar intersects with at least some of the plurality of first conductive layers; and a first structure that extends in the stacked body in the memory portion and the stair portion in the stacking direction and a first direction intersecting with the stacking direction and divides the stacked body, the first structure including a projection on a side surface thereof in the stair portion, the projection continuously extending in the stacking direction across the plurality of first conductive layers, wherein the plurality of first conductive layers each have upper and lower surfaces covered with a second conductive layer, and the second conductive layer is provided to cover at least a part of a surface of the projection in the first structure, the surface facing the plurality of first conductive layers, and the first structure includes:
a second insulating layer that is provided in the projection, and
a third insulating layer that covers end surfaces of the plurality of first conductive layers and the first insulating layer facing toward the first structure through a position of the projection and a position where the projection does not exist while interposing the second insulating layer therebetween at the position of the projection, and continuously extends in the first structure over the memory portion and the stair portion.

9. The semiconductor storage device according to claim 8, further comprising:
a fourth insulating layer that covers the upper and lower surfaces of each of the plurality of first conductive layers, wherein the fourth insulating layer surrounds a circumference of the second insulating layer at a height position of each of the plurality of first conductive layers in the projection in the first structure, and the second conductive layer covers the at least a part of the surface of the projection while interposing the fourth insulating layer therebetween.

10. The semiconductor storage device according to claim 8, further comprising:
a second pillar that extends in the stacked body in the stair portion in the stacking direction, wherein
a cross sectional area of the projection is smaller than a cross sectional area of the second pillar at a same height position in the stacking direction.

11. The semiconductor storage device according to claim 8, wherein the stacked body includes a first stacked portion and a second stacked portion that is arranged above the first stacked portion, the first pillar includes a first sub-pillar which is arranged in the first stacked portion, and a second sub-pillar which is arranged in the second stacked portion and is connected to the first sub-pillar via a portion with an increased diameter, and the projection is made into an integrated shape over the first stacked portion and the second stacked portion.

12. The semiconductor storage device according to claim 8, wherein the projection includes a plurality of projections arranged along the first direction, and the plurality of projections are regularly arranged.

13. The semiconductor storage device according to claim 8, wherein the first structure includes the projection including a plurality of projections, which are arranged along the first direction, on both sides of the first structure in a width direction thereof, and the plurality of projections are arranged at positions opposite to each other on the both sides of the first structure in the width direction.

14. The semiconductor storage device according to claim 8, wherein a length of the projection in the first direction is equal to or shorter than a length of the projection in a direction intersecting with the stacking direction and the first direction.

15. The semiconductor storage device according to claim 8, wherein a length of an inside end portion of the projection in the first direction is longer than a length of an outside end portion of the projection in the first direction, the inside end portion being located inward the first structure and the outside end portion being located outward the first structure in a direction intersecting with the stacking direction and the first direction.

16. A semiconductor storage device, comprising:
a stacked body that includes a plurality of first conductive layers stacked with a first insulating layer interposed therebetween and has a stair portion in which end portions of the plurality of first conductive layers have a stair shape and a memory portion in which a plurality of memory cells are arranged;
a first pillar that extends in the stacked body in the memory portion in a stacking direction of the stacked body, the plurality of memory cells being formed at portions where the first pillar intersects with at least some of the plurality of first conductive layers; and
a first structure that extends in the stacked body in the memory portion and the stair portion in the stacking direction and a first direction intersecting with the stacking direction and divides the stacked body, the first structure including a projection on a side surface thereof in the stair portion, the projection continuously extending in the stacking direction across the plurality of first conductive layers, wherein
the plurality of conductive layers each have upper and lower surfaces covered with a metal element-containing insulating layer, and the metal element-containing insulating layer is provided to cover at least a part of a surface of the projection in the first structure, the surface facing the plurality of conductive layers, the first structure includes:
a second insulating layer that is provided in the projection; and,
a third insulating layer that covers end surfaces of the plurality of first conductive lavers and the first insulating layer facing toward the first structure through a position of the projection and a position where the projection does not exist while interposing the second insulating layer therebetween at the position of the projection, and continuously extends in the first structure over the memory portion and the stair portion, and
the metal element-containing insulating layer is further provided to be interposed between the second insulating layer and the third insulating layer.

17. The semiconductor storage device according to claim 16, wherein the metal element-containing insulating layer is provided to surround a circumference of the projection at a height position of each of the plurality of conductive layers in the projection in the first structure.

* * * * *